(12) United States Patent
Hwang et al.

(10) Patent No.: US 11,670,707 B2
(45) Date of Patent: Jun. 6, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: David K. Hwang, Boise, ID (US); John F. Kaeding, Boise, ID (US); Richard J. Hill, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/840,250

(22) Filed: Jun. 14, 2022

(65) Prior Publication Data

US 2022/0310831 A1 Sep. 29, 2022

Related U.S. Application Data

(62) Division of application No. 17/035,542, filed on Sep. 28, 2020, now Pat. No. 11,393,920.

(51) Int. Cl.
*H01L 21/00* (2006.01)
*H01L 29/76* (2006.01)
(Continued)

(52) U.S. Cl.
CPC .... *H01L 29/7606* (2013.01); *H01L 21/02521* (2013.01); *H01L 21/02527* (2013.01); *H01L 21/02568* (2013.01); *H01L 27/10808* (2013.01); *H01L 27/10855* (2013.01); *H01L 27/10873* (2013.01); *H01L 27/10897* (2013.01);
(Continued)

(58) Field of Classification Search
CPC .......... H01L 29/7606; H01L 21/02521; H01L 21/02527; H01L 21/02568; H01L 27/10808; H01L 27/10855; H01L 27/10873; H01L 27/10897; H01L 27/11507; H01L 27/11509; H01L 29/1606; H01L 29/26; H01L 29/66045;
(Continued)

(56) References Cited

U.S. PATENT DOCUMENTS 9,076,686 B1 7/2015 Karda et al.
9,276,092 B1 3/2016 Karda et al.
(Continued)

FOREIGN PATENT DOCUMENTS

KR 10-2011-0002081 1/2011
WO WO 12/2021
PCT/US2021/049144

OTHER PUBLICATIONS

Cao et al., "2-D Layered Materials for Next-Generation Electronics: Opportunities and Challenges", IEEE Transactions on Electron Devices vol. 65, No. 10, Oct. 2018, United States, pp. 4109-4121.
(Continued)

*Primary Examiner* — Richard A Booth
(74) *Attorney, Agent, or Firm* — Wells St. John P.S.

(57) ABSTRACT

Some embodiments include an integrated assembly having a conductive structure, an annular structure extending through the conductive structure, and an active-material-structure lining an interior periphery of the annular structure. The annular structure includes dielectric material. The active-material-structure includes two-dimensional-material. Some embodiments include methods of forming integrated assemblies.

20 Claims, 25 Drawing Sheets

(51) Int. Cl.
- *H01L 29/66* (2006.01)
- *H01L 27/11509* (2017.01)
- *H01L 27/108* (2006.01)
- *H01L 29/16* (2006.01)
- *H01L 29/26* (2006.01)
- *H01L 29/786* (2006.01)
- *H01L 21/02* (2006.01)
- *H01L 27/11507* (2017.01)

(52) U.S. Cl.
CPC .. *H01L 27/11507* (2013.01); *H01L 27/11509* (2013.01); *H01L 29/1606* (2013.01); *H01L 29/26* (2013.01); *H01L 29/66045* (2013.01); *H01L 29/66969* (2013.01); *H01L 29/78642* (2013.01); *H01L 29/78696* (2013.01)

(58) Field of Classification Search
CPC ......... H01L 29/66969; H01L 29/78642; H01L 29/78696
See application file for complete search history.

(56) References Cited

U.S. PATENT DOCUMENTS

| | | |
|---|---|---|
| 9,276,134 B2 | 3/2016 | Karda et al. |
| 9,337,210 B2 | 5/2016 | Karda et al. |
| 9,678,037 B2 | 6/2017 | Liang et al. |
| 9,991,122 B2 | 6/2018 | Meade et al. |
| 2009/0251845 A1 | 10/2009 | Kiehlbauch |
| 2012/0248398 A1 | 10/2012 | Liu |
| 2015/0295084 A1 | 10/2015 | Obradovic et al. |
| 2016/0365291 A1 | 12/2016 | Barth, Jr. et al. |
| 2019/0378834 A1 | 12/2019 | Penumatcha et al. |
| 2020/0066917 A1 | 2/2020 | Kula et al. |
| 2020/0083059 A1 | 3/2020 | Hopkins et al. |
| 2021/0050443 A1 | 2/2021 | Karda et al. |
| 2021/0057424 A1 | 2/2021 | Karda et al. |
| 2022/0045060 A1 | 2/2022 | Sills et al. |
| 2022/0045061 A1 | 2/2022 | Lee et al. |
| 2022/0045069 A1 | 2/2022 | Sills et al. |
| 2022/0069133 A1 | 3/2022 | Hwang et al. |

OTHER PUBLICATIONS

Desai et al., "MoS2 Transistors with 1-Nanometer Gate Lengths", Science vol. 354, Issue 6308, Oct. 7, 2016, United States, pp. 99-102.

Jin et al., "Novel Chemical Route for Atomic Layer Deposition of MoS2 Thin Film on SiO2/Si Substrate", Nanoscale 6, 2014, United Kingdom, pp. 14453-14458.

Novoselov et al., "Electric Field Effect in Atomically Thin Carbon Films", Science vol. 306, No. 5696, Oct. 22, 2004, United States, 5 pages.

Robinson, "YMTC Xtacking 3D NAND Launched", available online at https://www.servethehome.com/ymtc-xtacking-3d-nand-launched/, Aug. 6, 2018, 2 pages.

Royal Swedish Academy of Sciences, "Graphene: Scientific Background on the Nobel Prize in Physics 2010", Kungl. Vetenskaps-Akademien, Oct. 5, 2010, Sweden, 10 pages.

Schwierz et al., "Two-Dimensional Materials and their Prospects in Transistor Electronics", Nanoscale 7, 2015, United Kingdom, pp. 8261-8283.

Tan et al., "Atomic Layer Deposition of a MoS2 Film", Nanoscale 6, 2014, United Kingdom, pp. 10584-10588.

Yeo et al., "Low-Temperature Direct Synthesis of High Quality WS2 Thin Films by Plasma-Enhanced Atomic Layer Deposition for Energy Related Applications", Applied Surface Science vol. 459, 2018, Netherlands, pp. 596-605.

INTEGRATED ASSEMBLIES AND METHODS OF FORMING INTEGRATED ASSEMBLIES

RELATED PATENT DATA

This patent resulted from a divisional of U.S. patent application Ser. No. 17/035,542 filed Sep. 28, 2020, which is hereby incorporated herein by reference.

TECHNICAL FIELD

Integrated assemblies (e.g., integrated memory). Methods of forming integrated assemblies.

BACKGROUND

Transistors are utilized in a variety of semiconductor devices. Field effect transistors (FETs) include a channel region between a pair of source/drain regions, and include one or more gates configured to electrically connect the source/drain regions to one another through the channel region.

Vertical FETs (VFETs) have channel regions that are generally perpendicular to a primary surface of a substrate on which the transistors are formed. Polycrystalline silicon is conventionally used as a material of the channel region in the transistors. Two-dimensional-materials have also been investigated for use as the channel material due to their large band gap and good mobility properties compared to polycrystalline silicon. It can be problematic to incorporate two-dimensional-materials into transistors.

It is desired to develop new methods for incorporating two-dimensional-materials into transistor devices. It is also desired to develop improved transistor device configurations utilizing two-dimensional-materials.

BRIEF DESCRIPTION OF THE DRAWINGS

FIGS. 1A-9A are diagrammatic cross-sectional side views along the lines A-A of FIGS. 1-9, respectively.

DETAILED DESCRIPTION OF THE ILLUSTRATED EMBODIMENTS

Some embodiments include vertical transistors (VFETs) having two-dimensional-material as the active material of the transistors. Some embodiments include methods of forming VFETs.

Figure 11:
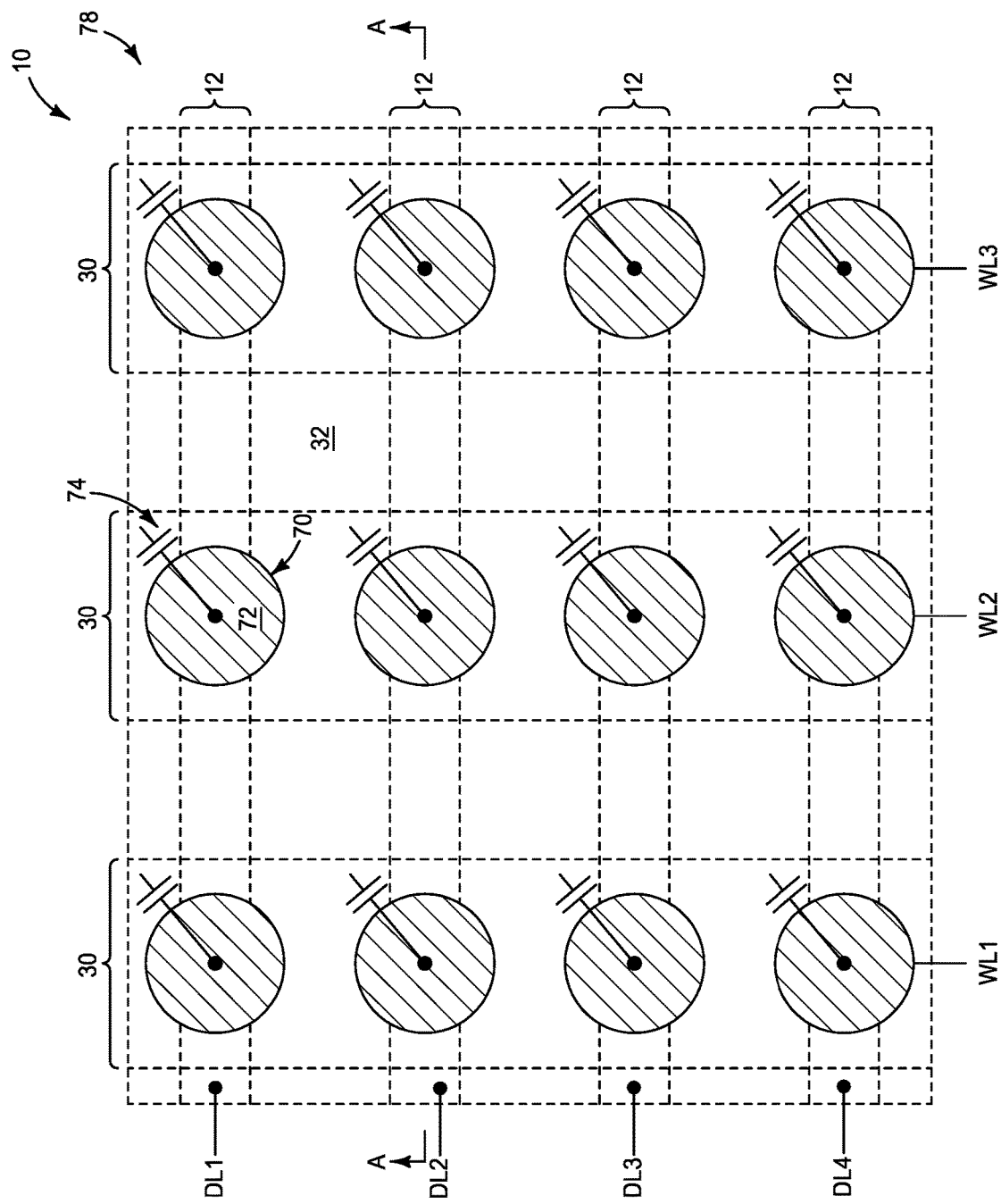
Figure 12:
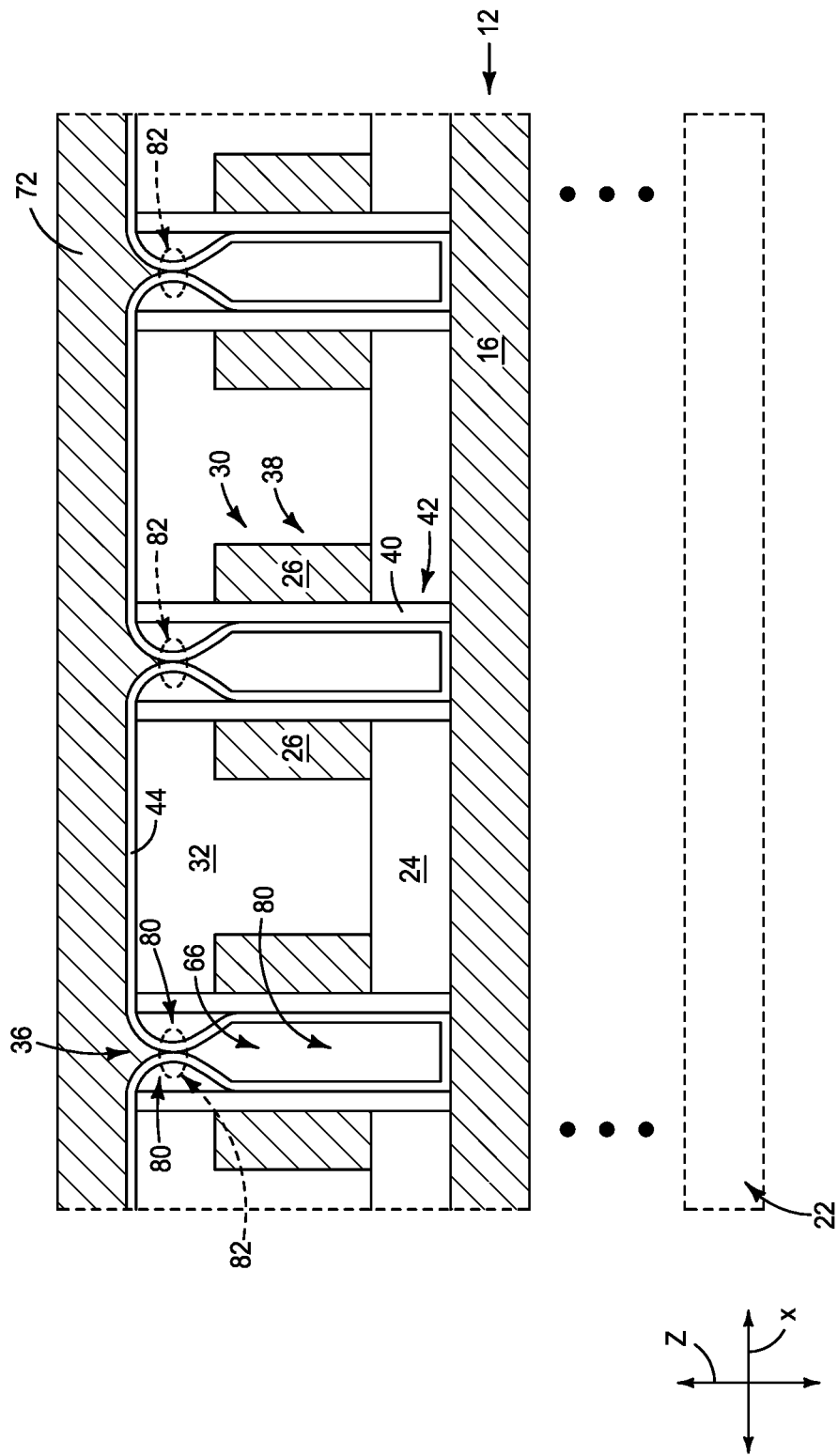
FIGS. 12 and 13 are diagrammatic cross-sectional side views of a region of an example integrated assembly at example sequential process stages of an example method. The process stage of FIG. 12 may follow the process stage of FIG. 6A.
Figure 13:
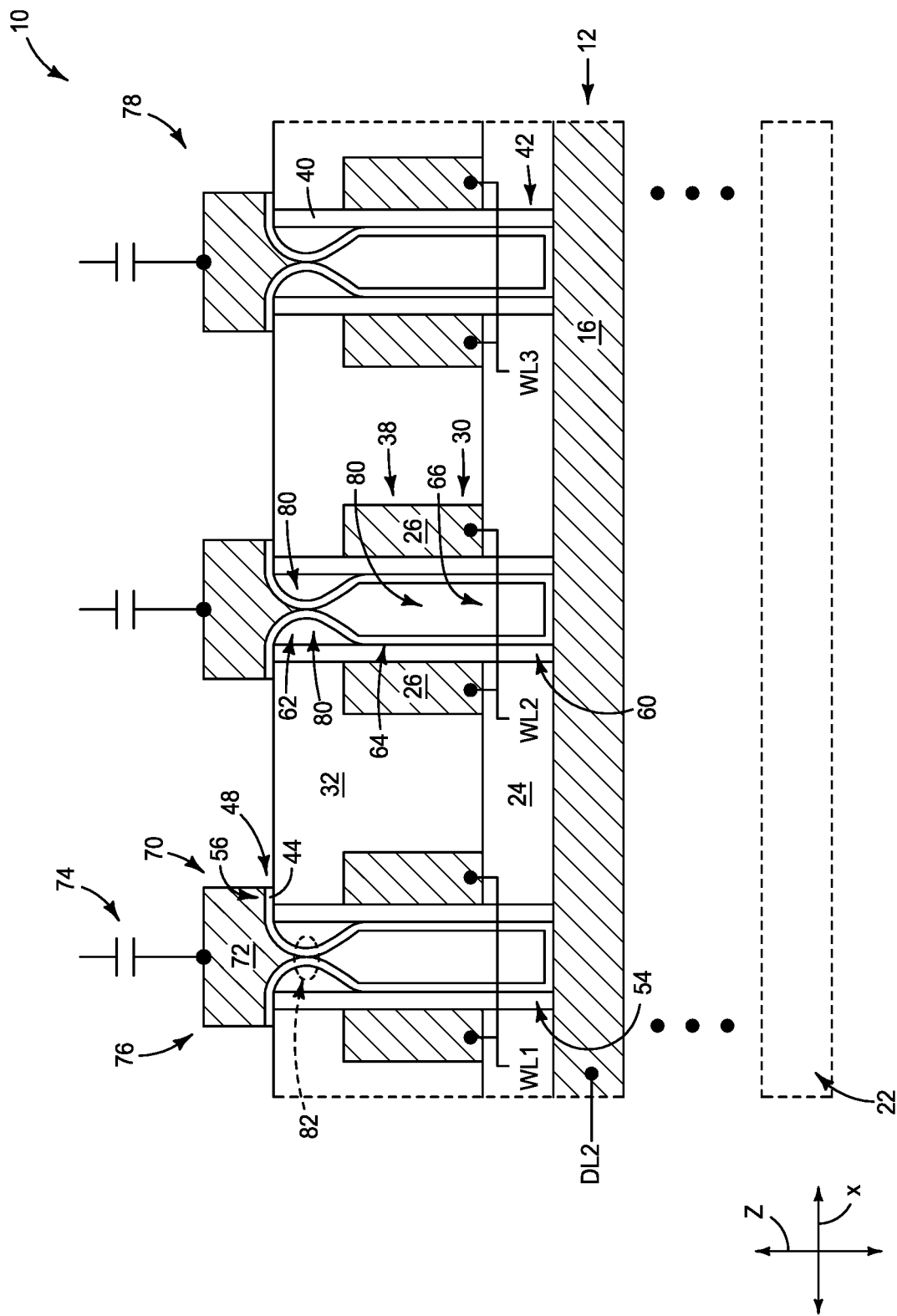

Example embodiments are described with reference to FIGS. 1-14. FIGS. 1-13 illustrate example process stages of example methods. FIGS. 9, 11 and 13 illustrate memory arrays comprising VFETs as access devices, and comprising capacitors as storage elements coupled with source/drain regions of the access devices.

Figure 1:
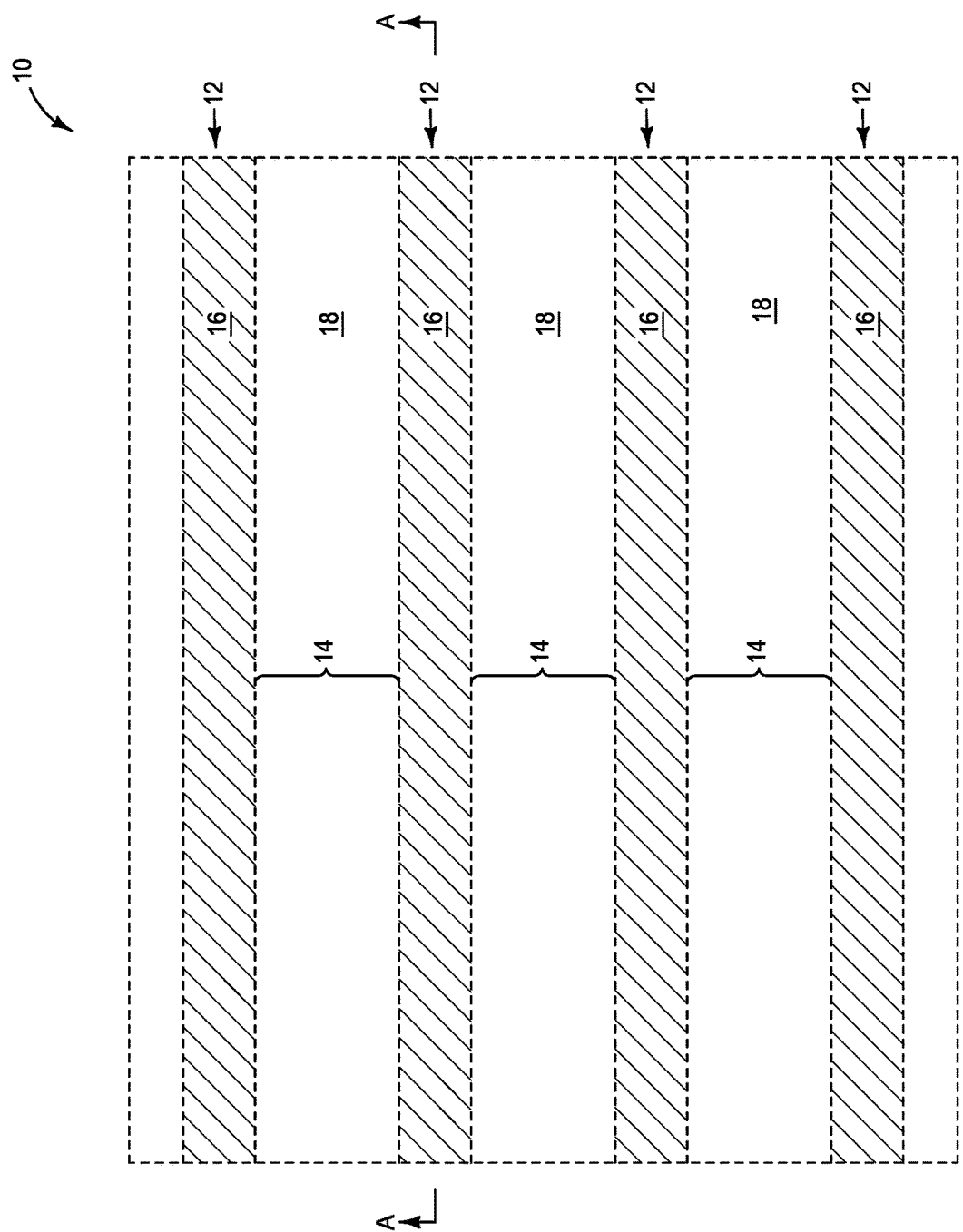
FIGS. 1-9 are diagrammatic top-down views of a region of an example integrated assembly at example sequential process stages of an example method.
Figure 1:
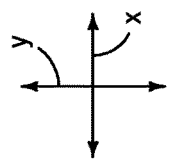
Figure 1A:
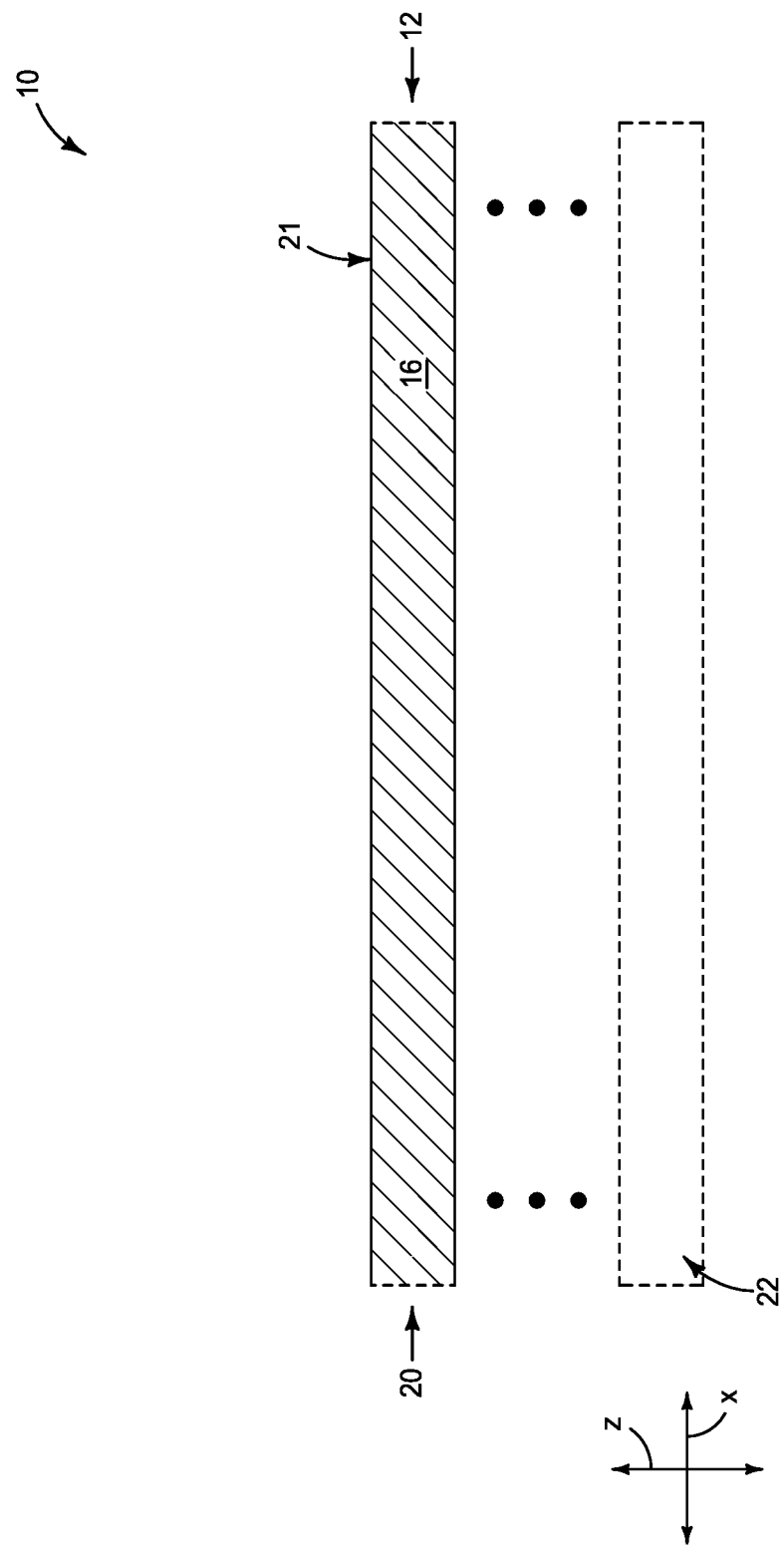

Referring to FIGS. 1 and 1A, an integrated assembly 10 includes first conductive structures 12 which extend along a first direction (an illustrated x-axis direction). The first conductive structures 12 are spaced from one another by insulative regions (intervening regions) 14. In some embodiments, the conductive structures 12 and the insulative regions 14 may be considered to alternate with one another along a second direction (an illustrated y-axis direction).

The conductive structures 12 comprise conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive material 16 may be referred to as first conductive material.

In some embodiments, the conductive structures 12 may be conductive lines, and may correspond to digit lines (bitlines, sense lines, etc.). Although the conductive structures 12 are shown to extend substantially straight along the x-axis direction, it is to be understood that in other embodiments the conductive structures 12 may be curved, wavy, etc.

The intervening regions 14 comprise insulative material 18. The insulative material 18 may comprise any suitable composition(s), and in some embodiments may comprise, consist essentially of, or consist of silicon dioxide. The insulative material 18 may be referred to as first insulative material, and the regions 14 may be referred as first insulative regions.

The structures 12 and insulative material 14 may be considered together to form a first construction 20. The construction 20 has a horizontally-extending upper surface 21. Such upper surface may be a planarized upper surface. The planarized upper surface may be formed utilizing any suitable planarization process, including, for example, chemical-mechanical polishing (CMP).

The construction 20 is supported by a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 22 and the construction 20 to indicate that other materials, components, etc., may be provided between the base 22 and the construction 20 in some embodiments.

Figure 2:
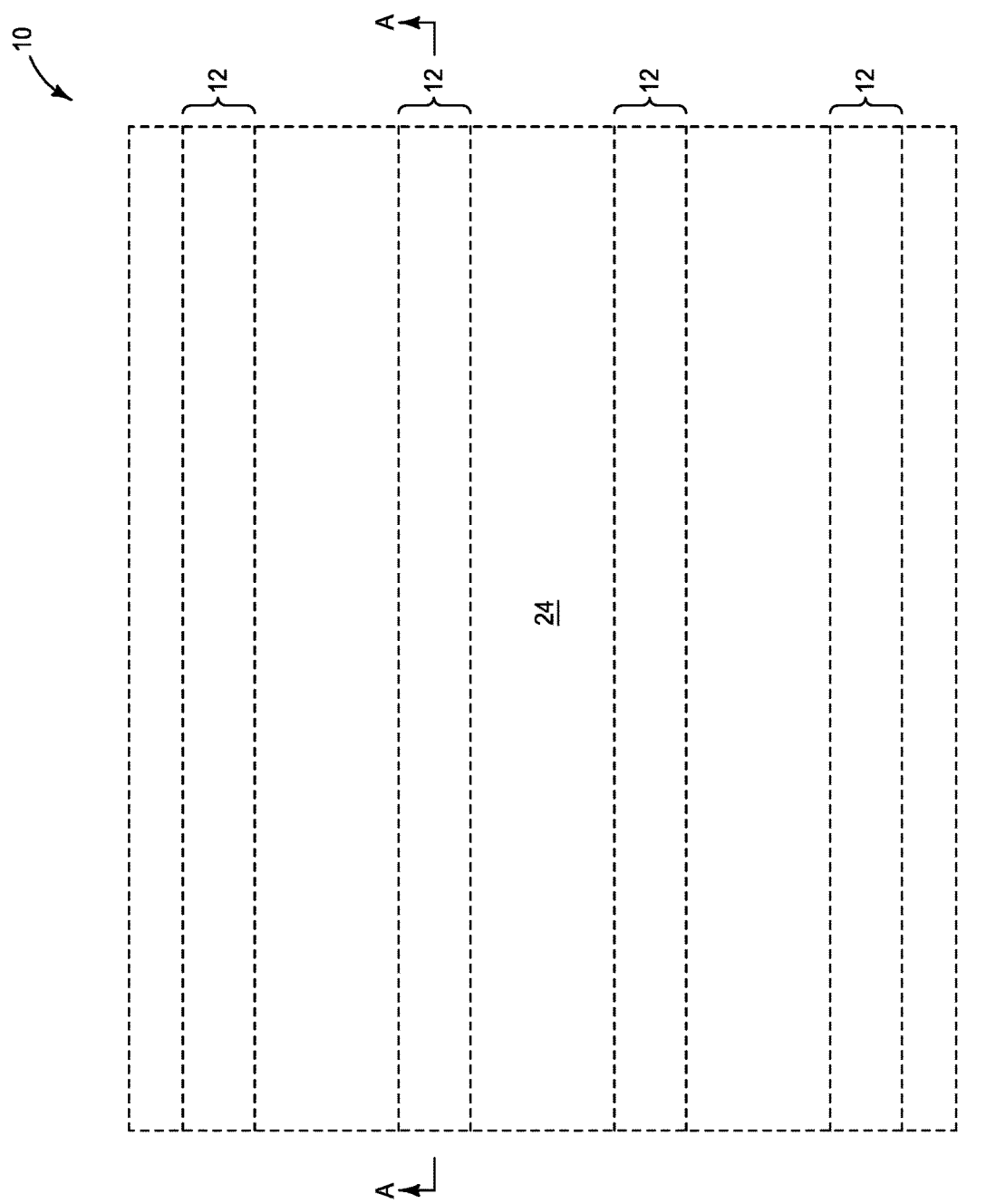
Figure 2A:
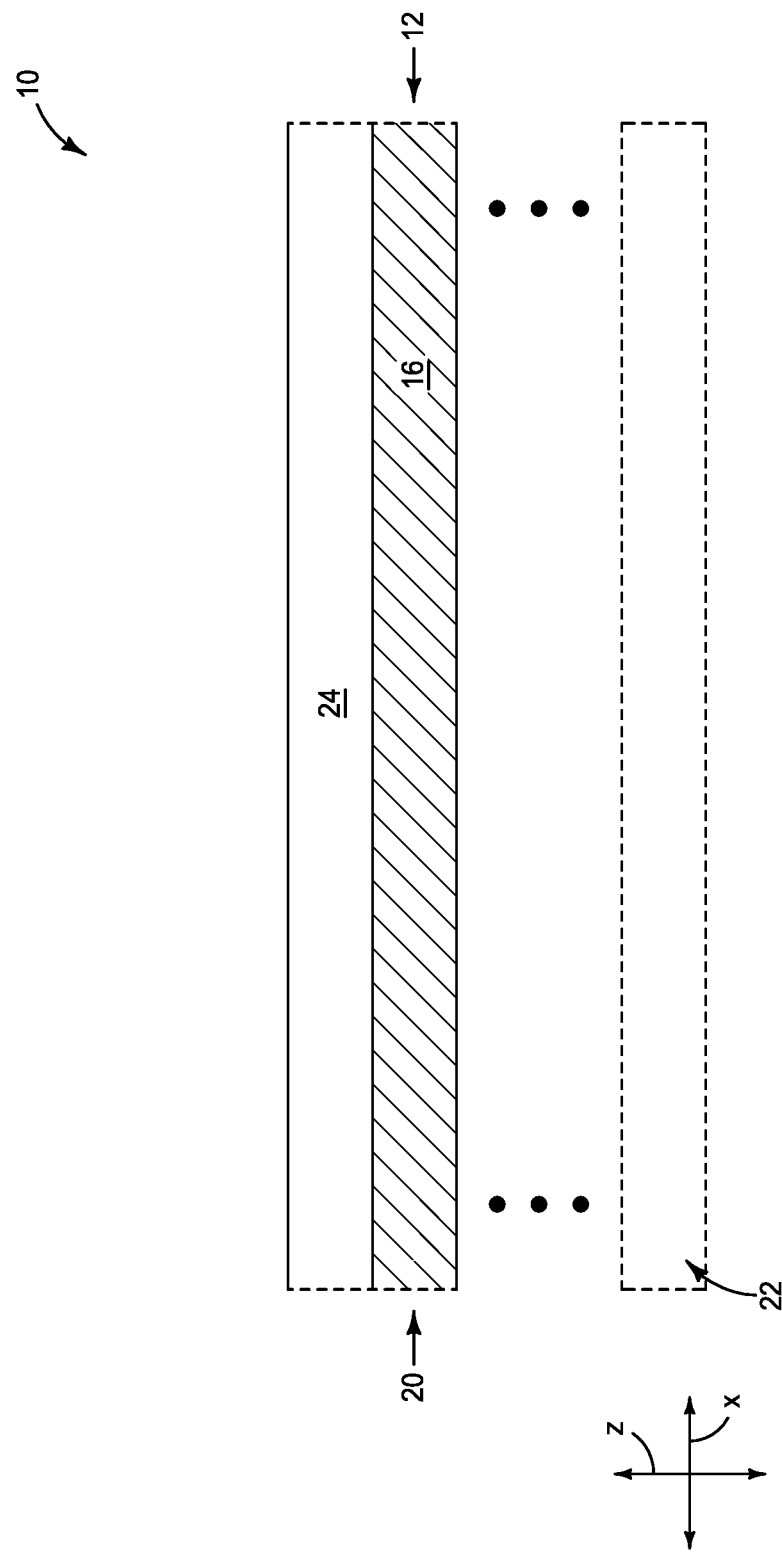

Referring to FIGS. 2 and 2A, insulative material 24 is formed over the construction 20. The conductive structures 12 are shown in dashed-line (phantom) view in the top-down illustration of FIG. 2 to indicate that such conductive structures are under the insulative material 24.

The insulative material 24 may comprise any suitable composition(s), and in some embodiments may comprise, consist essentially of, or consist of one or more of silicon dioxide, silicon nitride, aluminum oxide, hafnium oxide, etc. The insulative materials 18 (FIG. 1) and 24 may be the same composition as one another, or may comprise different compositions relative to one another. The insulative material 24 may be referred to as a second insulative material to distinguish it from the first insulative material 18. Alternatively, in some embodiments the insulative material 24 may be referred to as a first insulative material.

Figure 3:
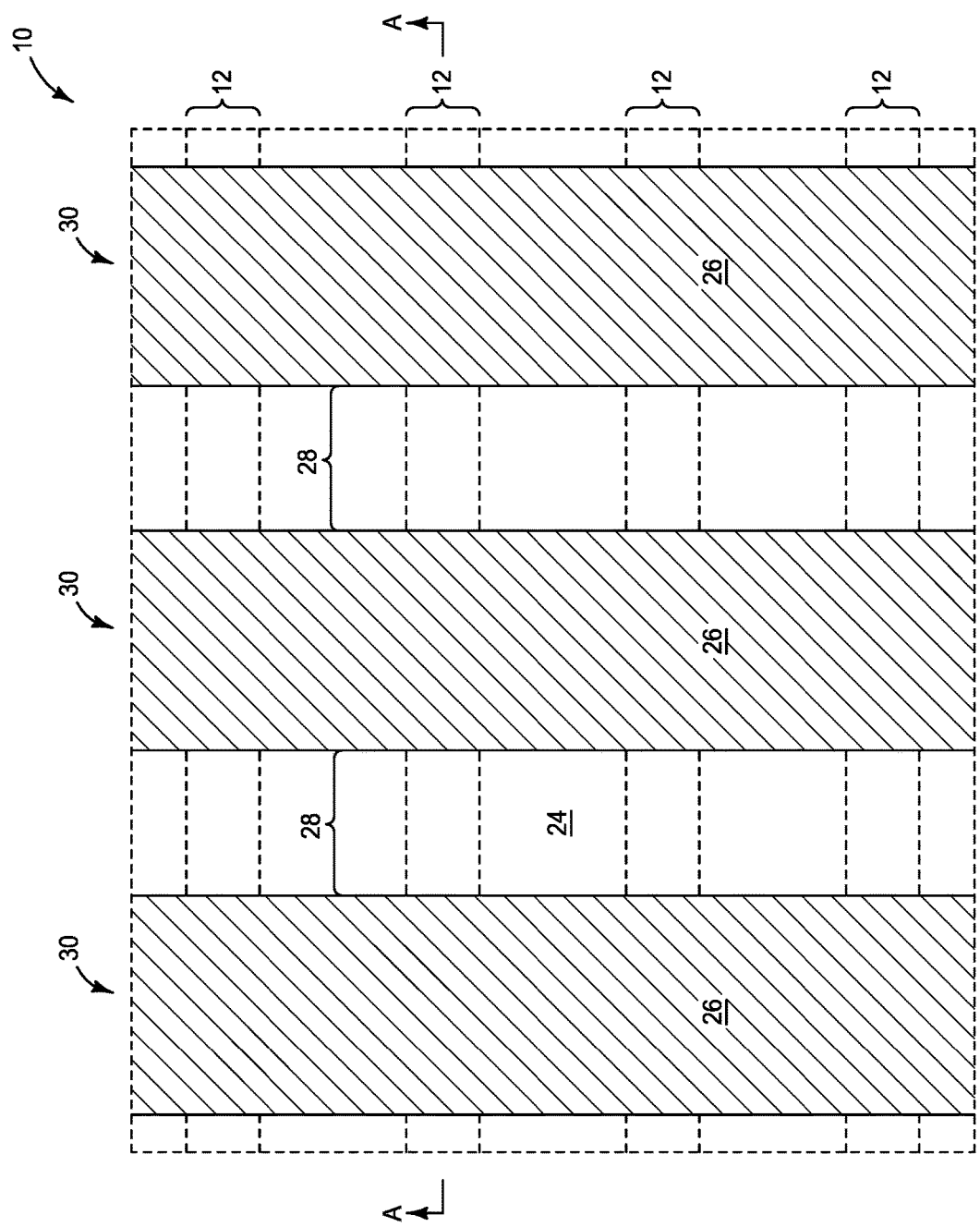
Figure 3A:
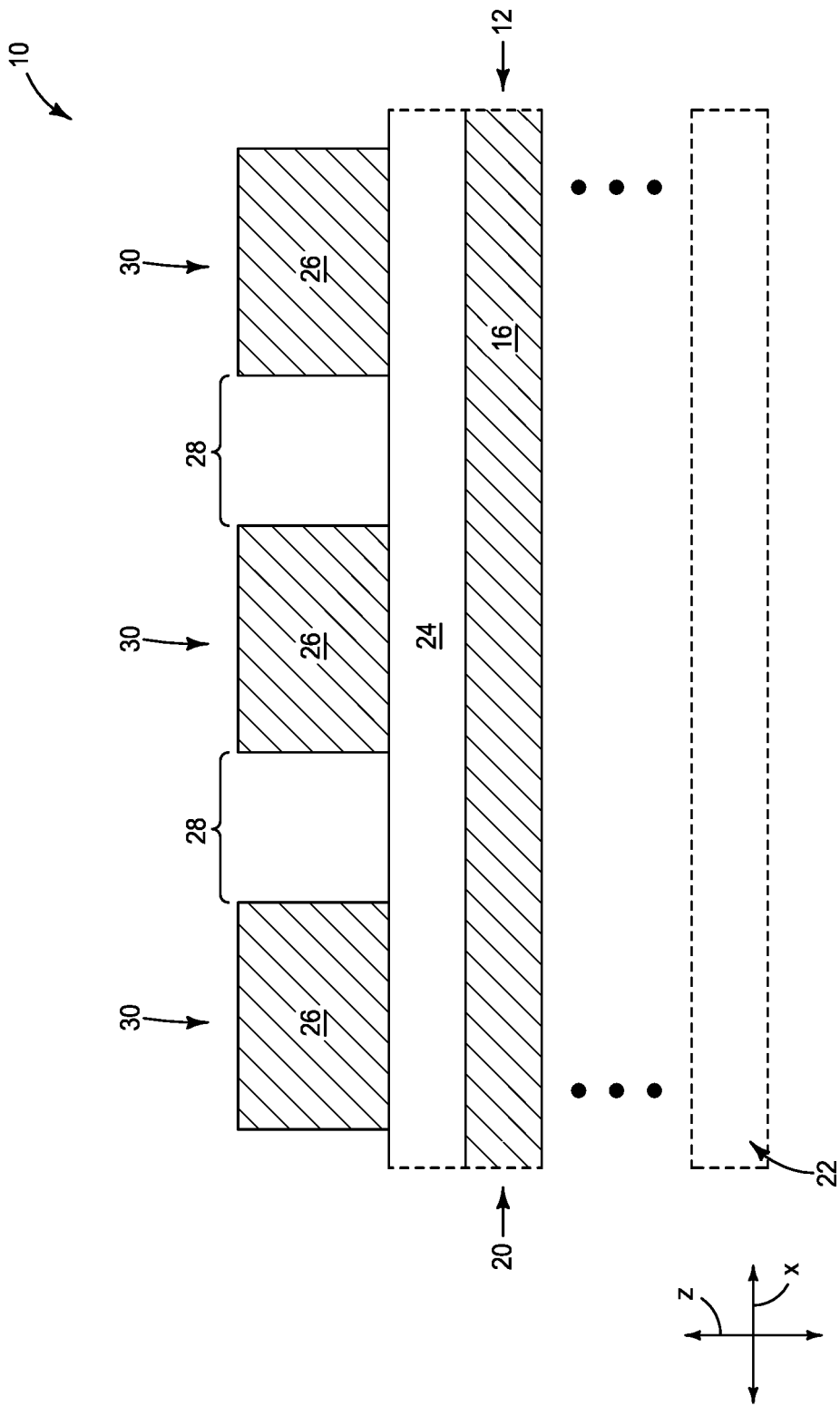

Referring to FIGS. 3 and 3A, conductive material 26 is formed over the insulative material 24. The conductive material 26 is patterned into second conductive structures 30.

The conductive material 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 16 and 26 may be the same composition as one another or may comprise different compositions relative to one another.

The second conductive structures 30 extend along a second direction (the illustrated y-axis direction) which crosses the first direction (the illustrated x-axis direction) of the first conductive structures 12. The second conductive structures 30 may correspond to wordlines (access lines) in some embodiments.

The second conductive structures 30 are spaced from one another along the first direction (the x-axis direction) by intervening regions 28. The intervening regions 28 are configured as trenches at the process stage of FIGS. 3 and 3A.

Figure 4:
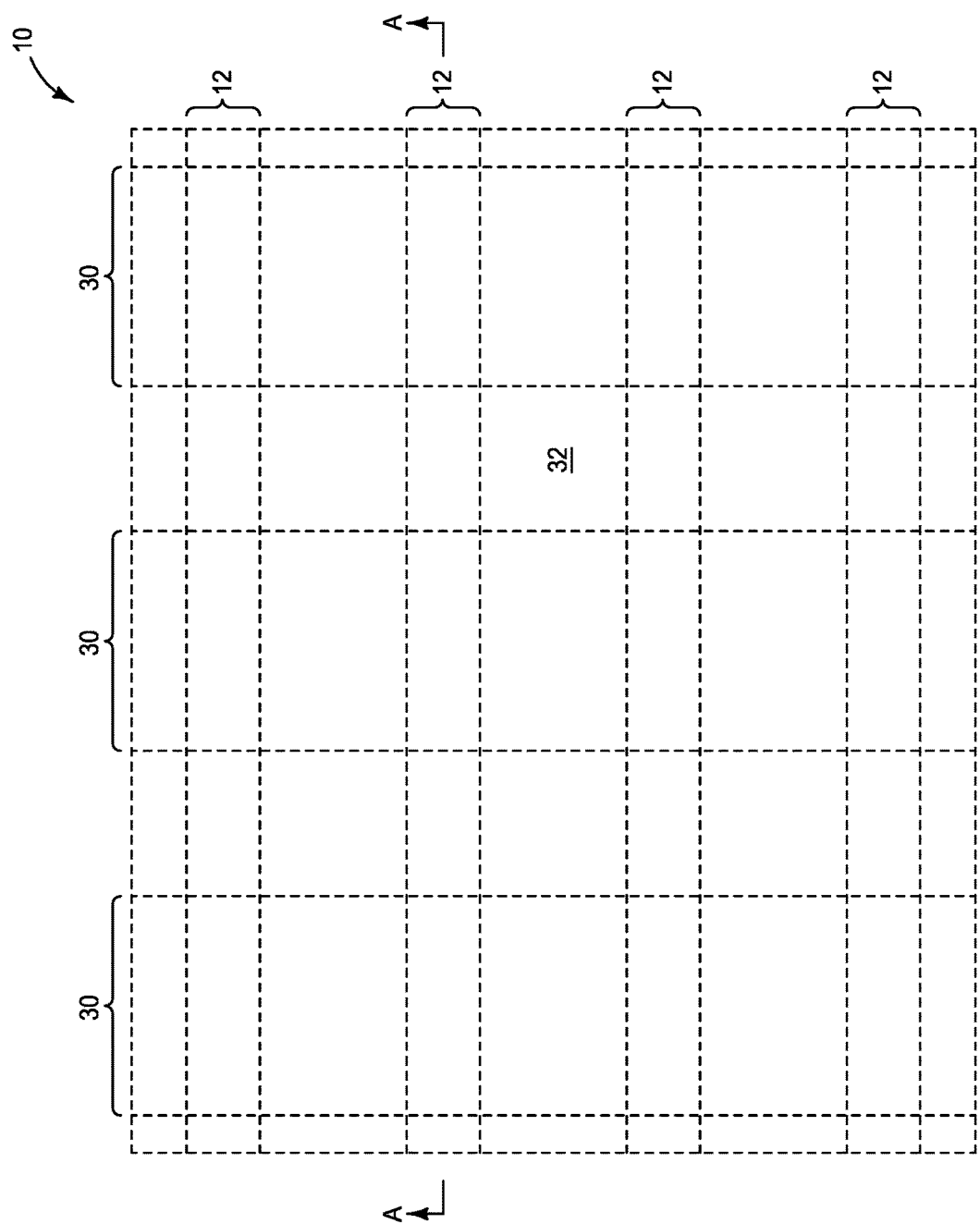
Figure 4A:
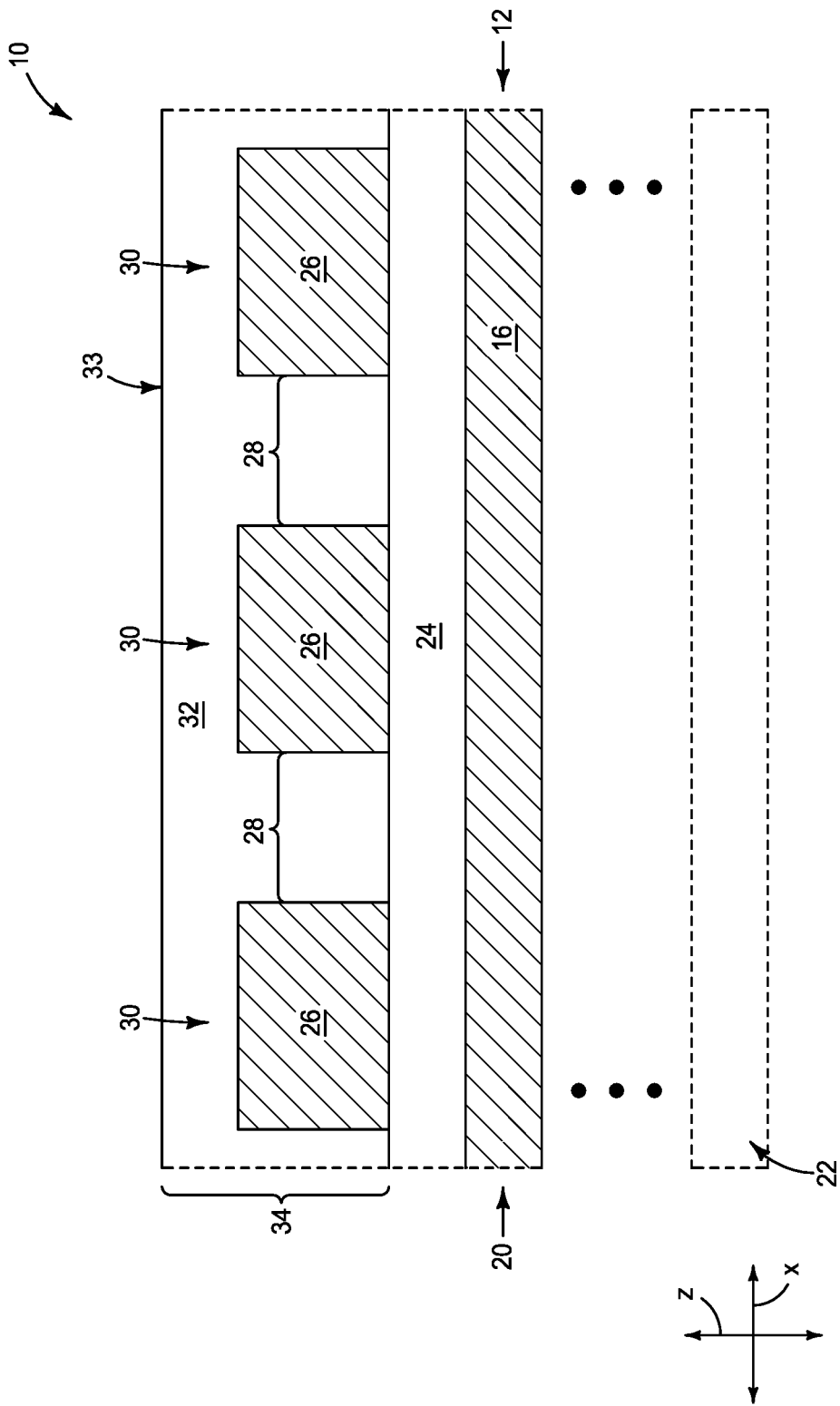

Referring to FIGS. 4 and 4A, insulative material 32 is formed over the conductive structures 30 and within the intervening regions 28. The insulative material 32 may comprise any suitable composition(s), and in some embodiments may comprise, consist essentially of, or consist of one or more of silicon dioxide, silicon nitride, aluminum oxide, hafnium oxide, zirconium oxide, etc. The insulative material 32 may or may not be the same composition as the insulative material 24.

The regions 28 having the insulative material 32 therein may be referred to as intervening insulative regions (or simply as insulative regions), and in some embodiments may be referred to as intervening second insulative regions to distinguish them from the intervening first insulative regions 14 of FIG. 1.

In the illustrated embodiment, a planarized surface 33 is formed over the insulative material 32. The planarized surface 33 may be formed with any suitable process, including, for example, CMP.

The materials 26 and 32 may be together considered to form a second construction 34. The construction 34 is supported by the insulative material 24.

Figure 5:
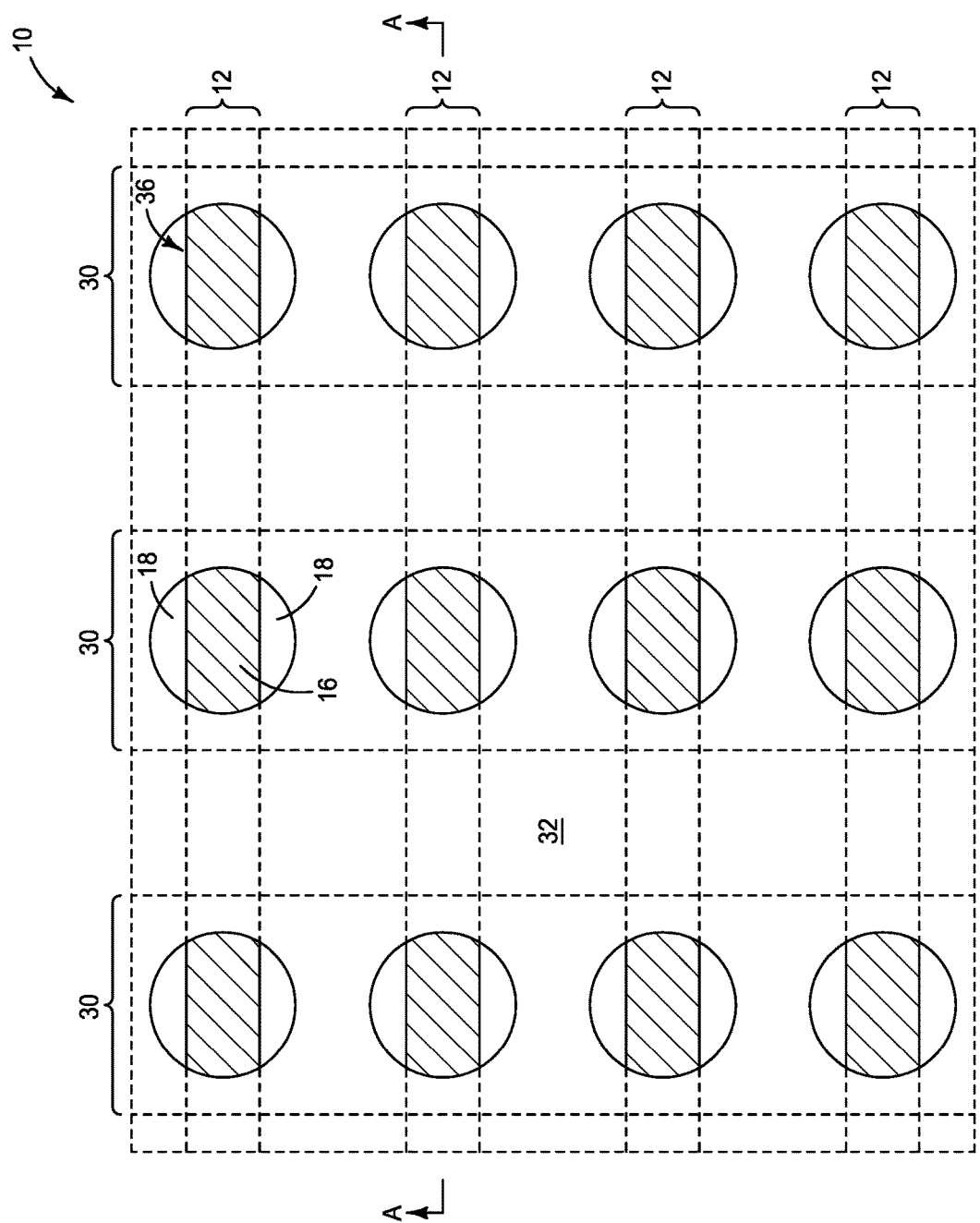
Figure 5A:
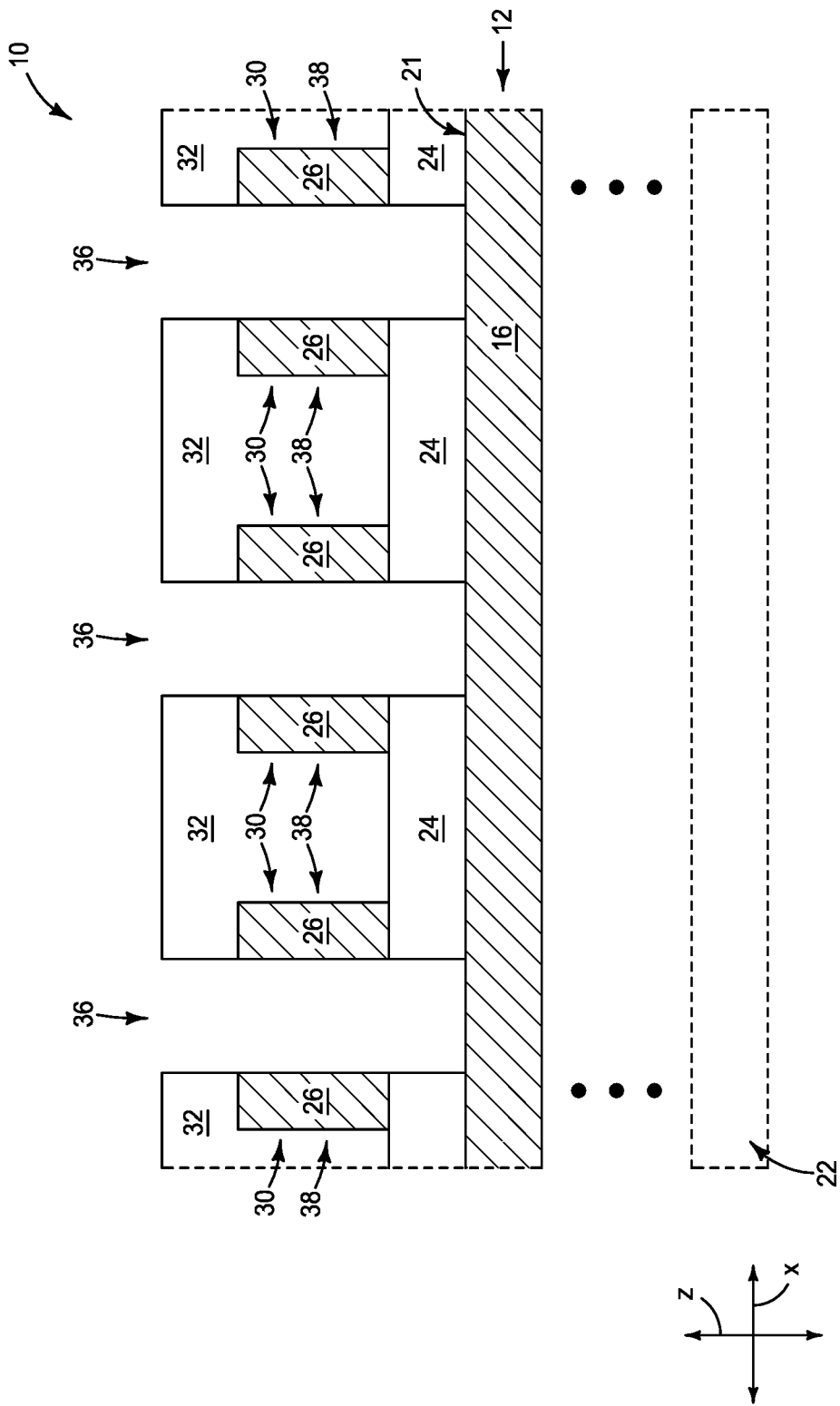

Referring to FIGS. 5 and 5A, openings 36 are formed to extend through the second insulative material 32, the conductive material 26, and the first insulative material 24. The openings 36 extend to the upper surface 21 of the digit-line-structures (first conductive structures) 12. In some embodiments, the openings 36 may extend into the conductive material 16 of the structures 12, rather than stopping at the upper surface of the structures 12.

The illustrated openings 36 are circular in top-down view. In other embodiments, the openings may have other suitable closed shapes. For instance, the openings may be oval, elliptical, polygonal (e.g., square, rectangular, etc.), etc., in top-down view. The illustrated openings 36 have vertically-straight sidewalls. In other embodiments, the sidewalls of the openings may be tapered.

Regions of the conductive material 26 of the structures 30 are adjacent the openings, as shown in the cross-sectional view of FIG. 5A. Such regions may be incorporated into gating structures 38. The gating structures 38 are ultimately utilized as gates of transistor devices (described below with reference to FIGS. 8 and 8A).

The openings 36 extend along an illustrated z-axis direction, and accordingly extend orthogonally (or at least substantially orthogonally) relative to the horizontally-extending upper surfaces 21 of the digit-line-structures 12. The term "substantially orthogonally" means orthogonally to within reasonable tolerances of fabrication and measurement. The openings 36 may be considered to extend vertically, or at least substantially vertically. In some embodiments, the openings 36 may extend at an angle of about 90° (i.e., 90°±10°) relative to the horizontally-extending surfaces 21 of the digit-line-structures 12.

Figure 6:
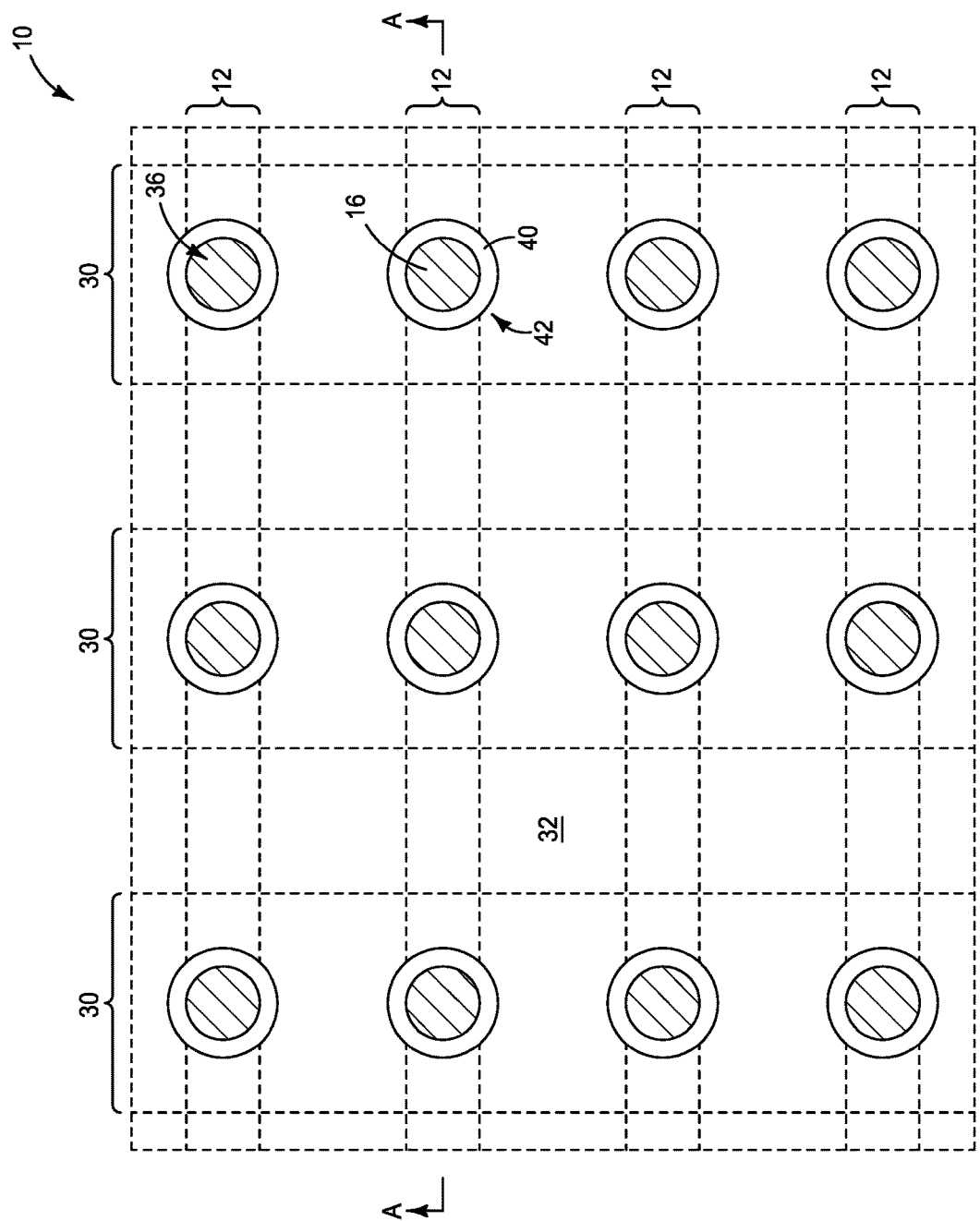
Figure 6A:
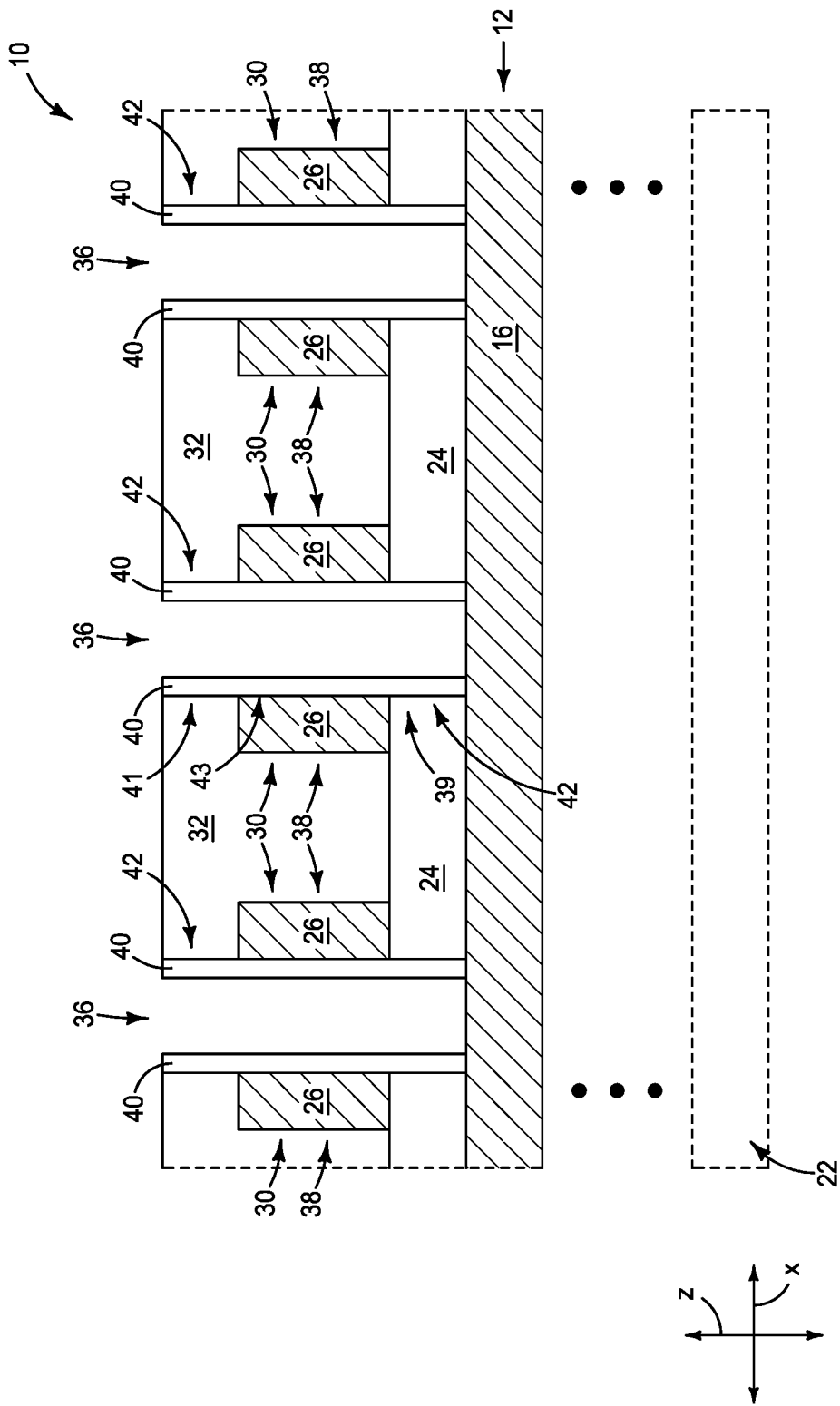

Referring to FIGS. 6 and 6A, dielectric material (insulative material) 40 is formed along sidewalls of the openings 36 to narrow the openings 36. The dielectric material 40 may ultimately comprise gate-dielectric-material of transistor devices, and may comprise any suitable composition(s). In some embodiments, the dielectric material 40 may comprise one or more of silicon dioxide, silicon nitride, aluminum oxide, hafnium oxide, etc. The dielectric material 40 may be formed to any suitable lateral thickness, and in some embodiments may be formed to a lateral thickness within a range of from about 2 nm to about 10 nm.

The dielectric material 40 is configured as annular structures (ring-shaped structures) 42. In the illustrated embodiment, the annular structures 42 are circular in top-down view, since such annular structures line sidewalls of the circular-shaped openings 36. In other embodiments, the annular structures 42 may have other shapes besides the illustrated circular shapes. For instance, the annular structures 42 may be oval, elliptical, polygonal, etc.

The illustrated configuration of the dielectric material 40 may be formed with any suitable processing. For instance, a layer of the dielectric material 40 may be deposited over an upper surface of the material 32 and within the openings 36, with the dielectric material 40 extending along the bottom surfaces of the opening 36. Subsequently, anisotropic etching may be utilized to remove the dielectric material 40 from over upper surfaces of the material 32, and from along the bottom surfaces of the openings 36, to leave the dielectric material 40 as the ring-shaped liners along the sidewalls of the openings 36.

In some embodiments, the annular structures 42 may be considered to extend through the conductive structures 30. Each of the annular structures 42 has a first region 39 above the conductive structures 30, a second region 41 beneath the conductive structures 30, and a third region 43 along the conductive structures 30. The third region 43 is vertically between the first and second regions 39 and 41.

In some embodiments, the annular structures 42 may be referred to as insulative rings (or as insulative-material-rings).

Figure 7:
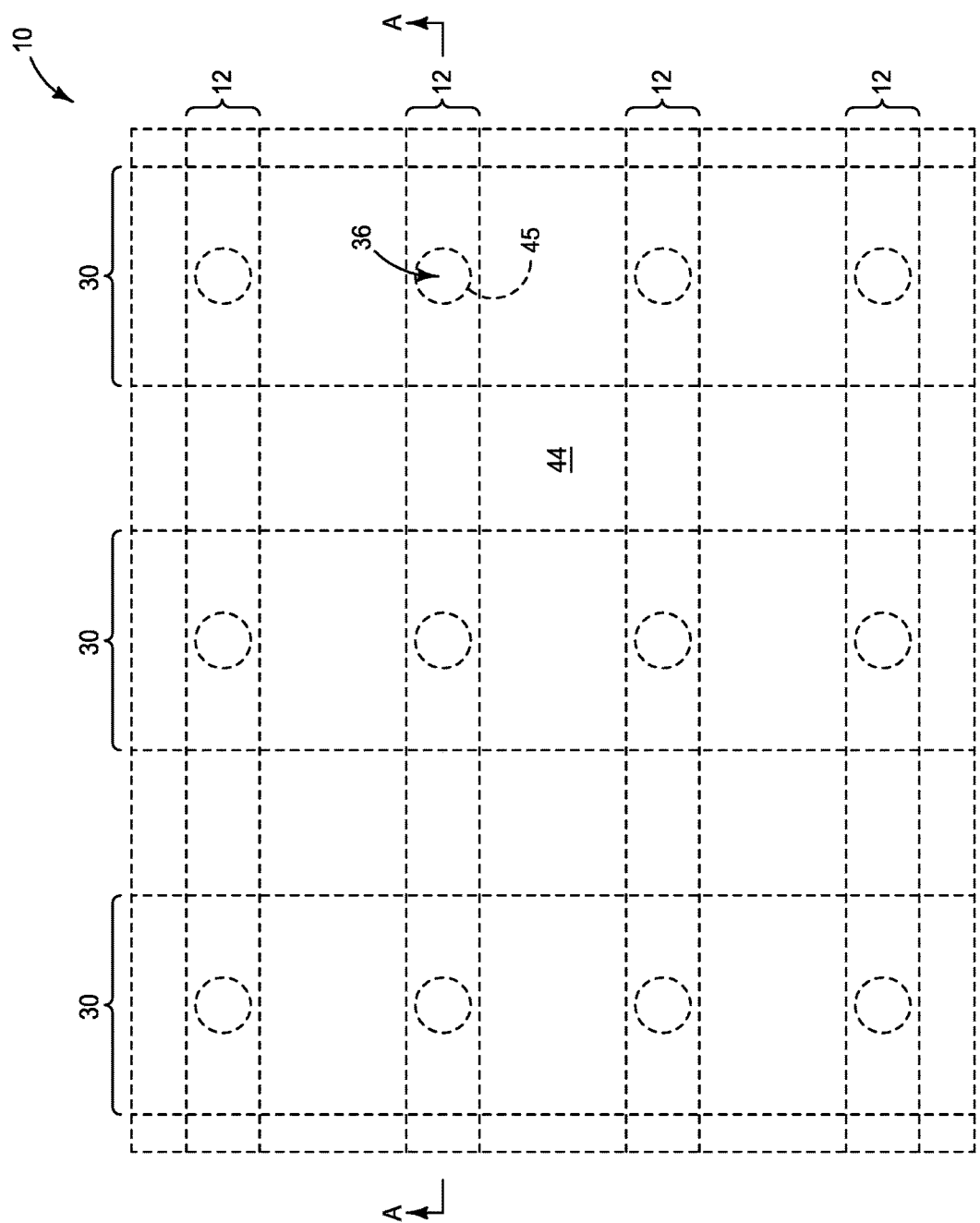
Figure 7A:
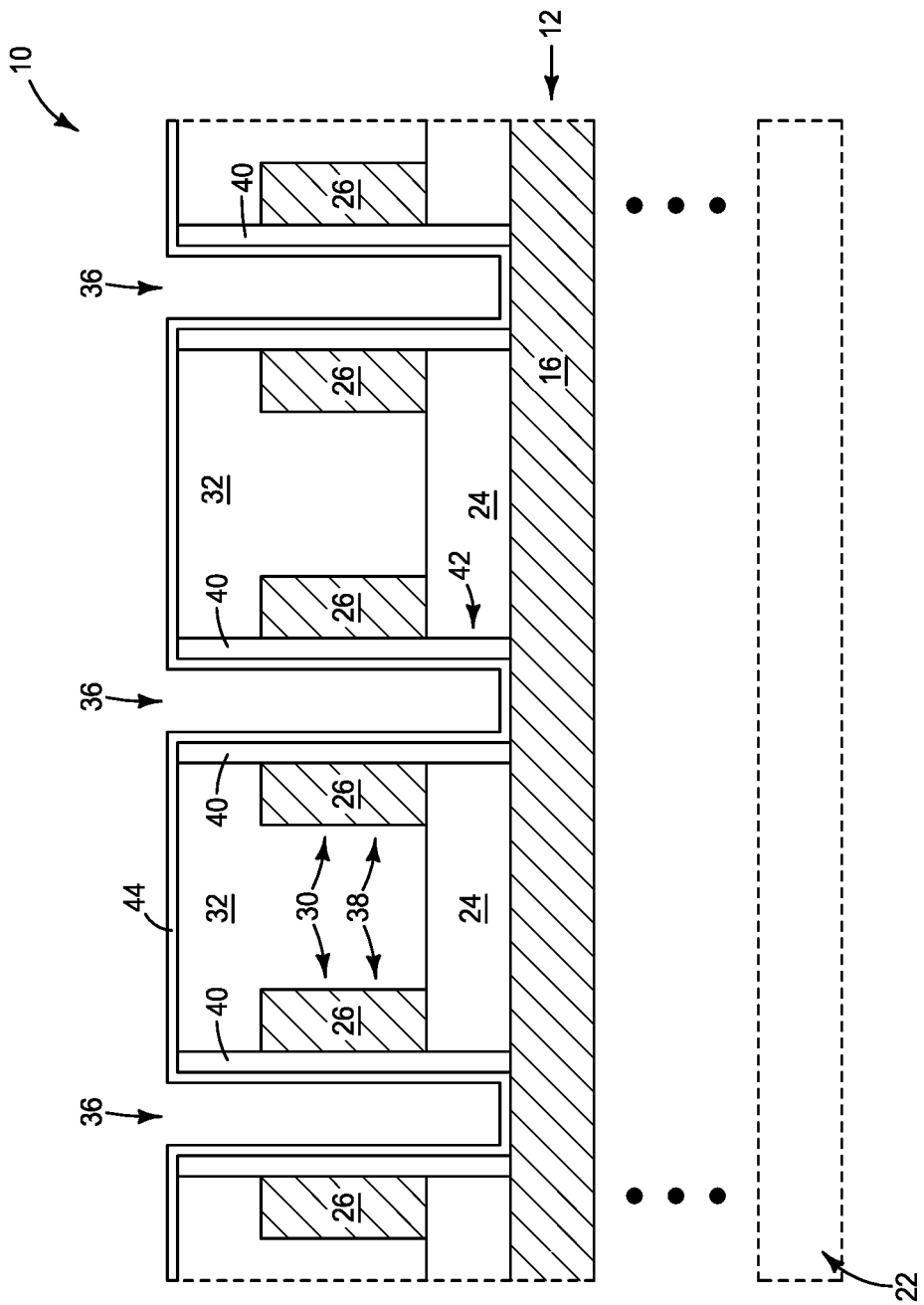

Referring to FIGS. 7 and 7A, two-dimensional-material 44 is formed to extend substantially conformally along the insulative material 32, and to extend into the narrowed openings 36. The term "substantially conformally" means conformally to within reasonable tolerances of fabrication and measurement. In the illustrated embodiment, the two-dimensional-material 44 directly contacts the conductive material 16 of the conductive structures 12 at the bottoms of the openings 36, as shown in FIG. 7A. Dashed-line circles 45 are provided within the top-down view of FIG. 7 to assist the reader in visualizing the openings 36.

The two-dimensional-material 44 may be formed with any suitable processing, including, for example, one or more of atomic layer deposition (ALD), chemical vapor deposition (CVD), physical vapor deposition (PVD), etc.

The term "two-dimensional-material" refers to a material having one or more layers with stronger forces within each layer (ionic, covalent, etc.) than along edges of the layers (e.g., between adjacent layers). The forces along edges of the layers (e.g., between adjacent layers) will generally be predominantly van der Waals forces. The two-dimensional-material 44 may comprise any suitable number of layers; and in some embodiments may comprise a stack having 1 to 10 separate layers. The two-dimensional-material 44 may have any suitable thickness, and in some embodiments may have a thickness within a range of from about 0.5 nm to about 5 nm.

The two-dimensional-material 44 may comprise any suitable composition(s); and in some embodiments may comprise one or more of carbon, boron, germanium, silicon, tin, phosphorus, bismuth, indium, molybdenum, platinum, rhenium, tungsten and hafnium. In some applications, the two-dimensional-material 44 may comprise one or more of graphene, graphyne, borophene, germanene, silicene, $Si_2BN$, stanene, phosphorene, bismuthene, molybdenum disulfide, molybdenum diselenide, tungsten disulfide, tungsten diselenide, tin disulfide, rhenium disulfide, indium disulfide, and hafnium disulfide. In some embodiments, the two-dimensional-material 44 may comprise transition metal dichalcogenide (TMDC). The TMDC has the chemical formula MX, such as $MX_2$, where M is a transition metal and X is a chalcogen (e.g., sulfur, selenium, tellurium, etc.). The transition metal may include, but is not limited to, molybdenum, tungsten, niobium, zirconium, hafnium, rhenium, platinum, titanium, tantalum, vanadium, cobalt, cadmium, chromium, etc.

The two-dimensional-material 44 may be entirely monocrystalline, or may be at least substantially entirely monocrystalline. The term "substantially entirely monocrystalline" means that the material is greater than or equal to about 95% monocrystalline, by volume.

Figure 8:
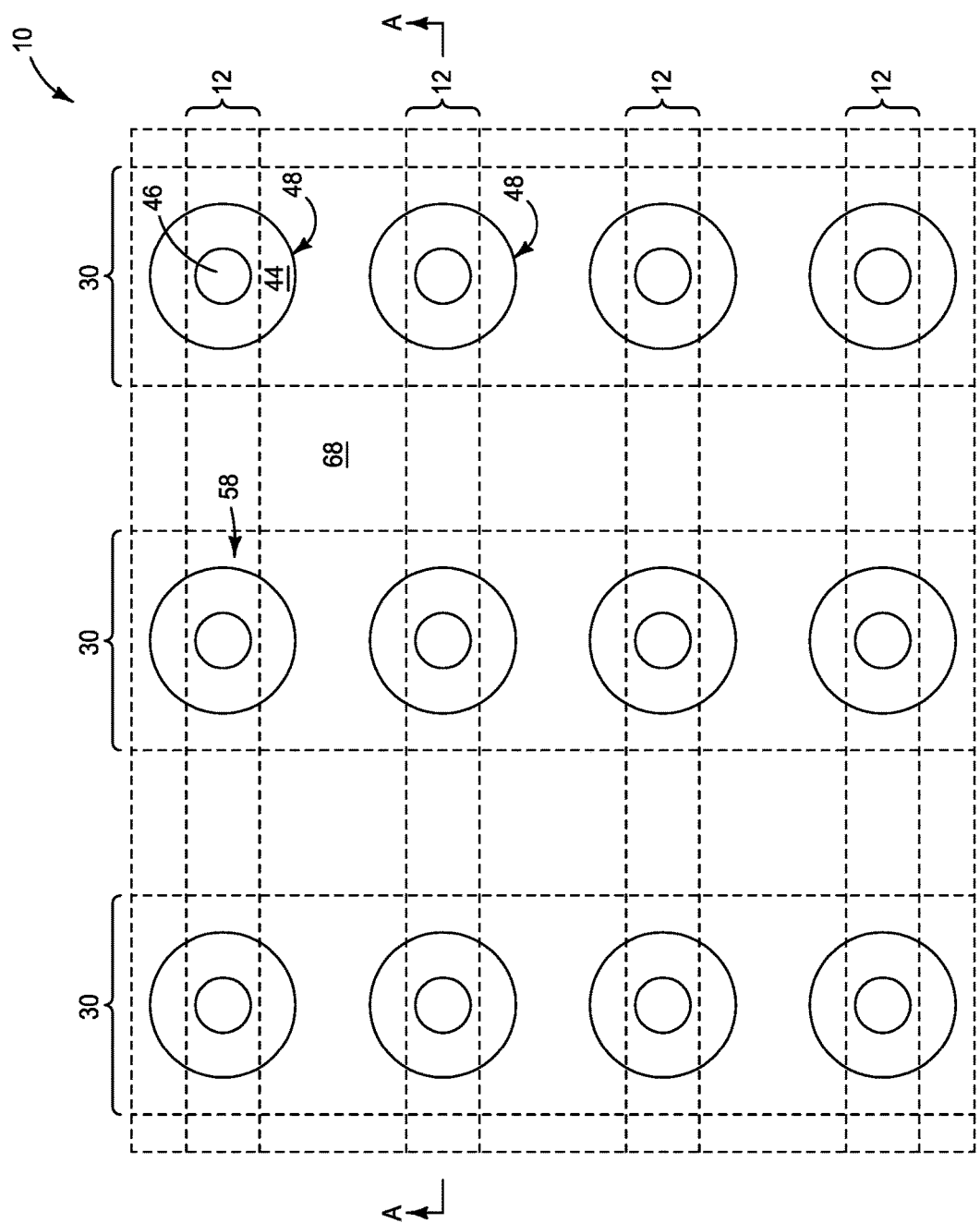
Figure 8A:
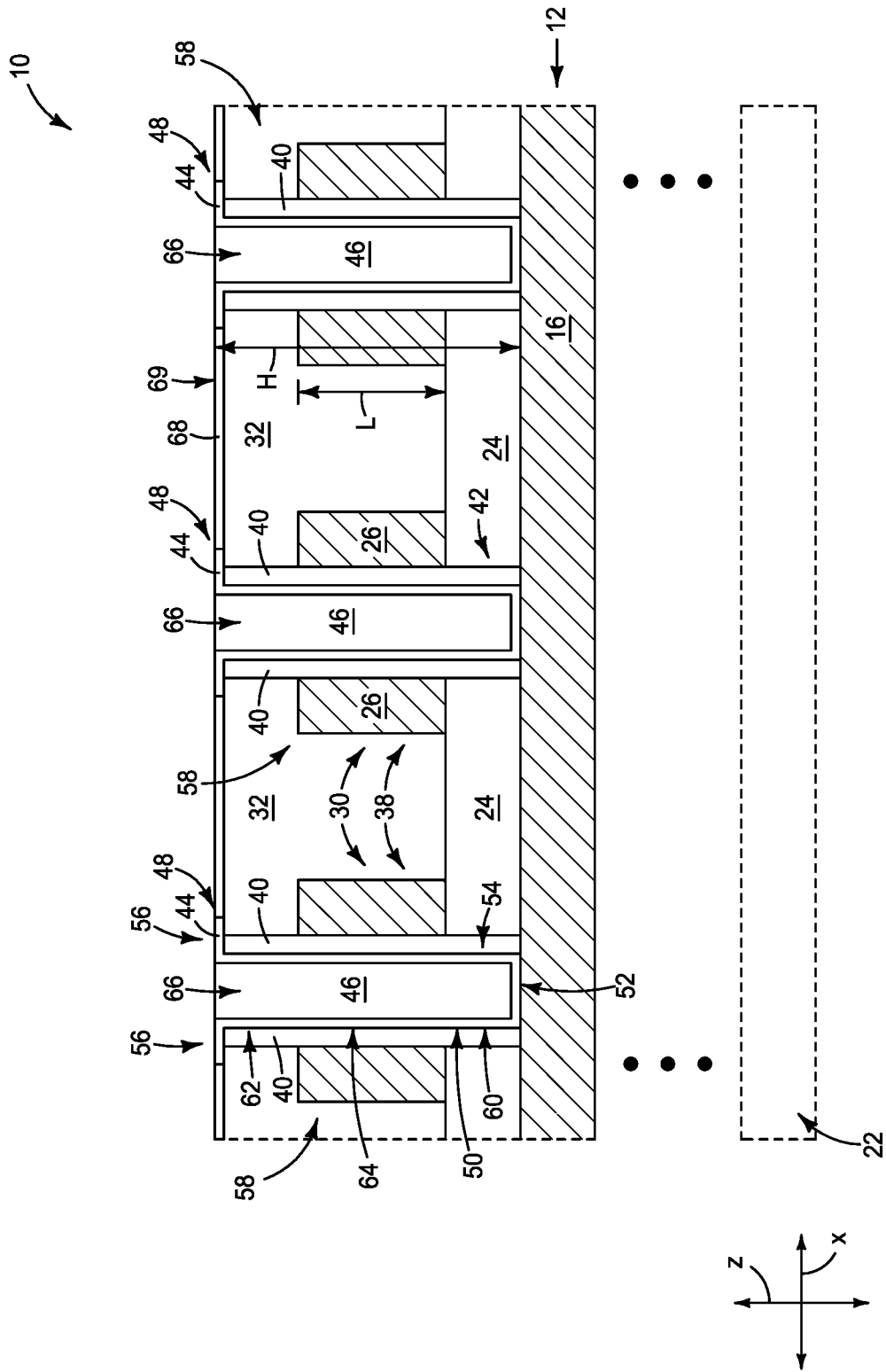
Figure 9:
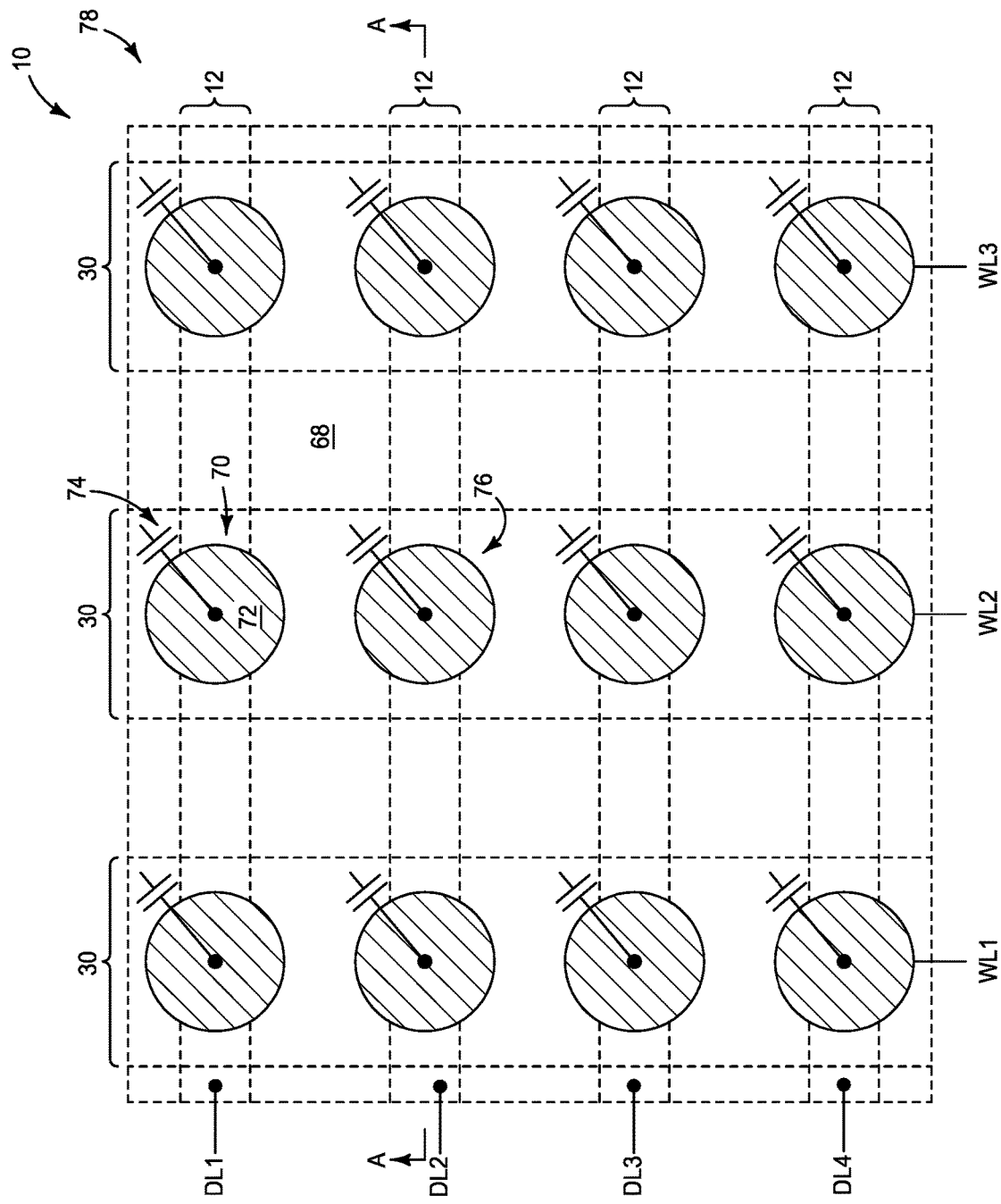

Referring to FIGS. 8 and 8A, insulative material 46 is formed within the openings 36, and the two-dimensional material 44 is patterned into segments 48. The patterning of the material 44 into the segments 48 may be conducted with any suitable processing. For instance, a photolithographically-patterned photoresist mask (not shown) may be utilized to protect regions of the material 44 while other regions are removed with one or more suitable etches, and then the mask may be removed to leave the configuration of FIGS. 8 and 8A. In the illustrated embodiment, the etching utilized to define the segments 48 stops at an upper surface of the material 32. In other embodiments, such etching may penetrate into the material 32.

The insulative material 46 may comprise any suitable composition(s). For instance, the insulative material 46 may comprise one or more of silicon dioxide, silicon nitride, aluminum oxide, hafnium oxide, zirconium oxide, etc. In some embodiments, the insulative material 46 may comprise one or more high-k compositions, with the term high-k meaning a dielectric constant greater than that of silicon dioxide (i.e., greater than about 3.9). The insulative material 46 may be solid or semi-solid. The insulative material 46 may be referred to as a third insulative material to distinguish it from the first and second insulative materials 24 and 32.

The insulative material 46 may be provided within the openings 36 (FIGS. 7 and 7A) at any suitable process stage. In some embodiments the insulative material 46 may be provided within the openings 36 prior to the patterning of the two-dimensional material 44 into the segments 48. In other embodiments, the insulative material 46 may be provided within the openings 36 after the patterning of the two-dimensional material 44 into the segments 48.

Each of the segments 48 includes an upwardly-opening container-shaped structure 50, with such container-shaped structure extending into one of the openings 36 described above with reference to FIGS. 7 and 7A. The container-shaped structures 50 each include a bottom region 52 directly adjacent the conductive material 16 of the digit-line-structures 12, an annular (ring-shaped) sidewall region 54 extending upwardly from the bottom region 52, and a ledge region 56 (with the ledge region 56 being over the materials 40 and 32, and extending outwardly from the sidewall region 54). In some embodiments, the structures 50 may be considered to be shaped similarly to upside-down brimmed hats (e.g., stovepipe hats, top hats, etc.), and accordingly may be referred to as having upside-down-brimmed-hat-configurations.

The segments 48 of the two-dimensional material 44 are incorporated into transistors 58 (VFETS in the shown embodiment). The two-dimensional material 44 is utilized as active material within the transistors 58, and accordingly the segments 48 may be referred to as active-material-structures. Such active-material-structures line the interior peripheries of the annular structures 42.

The segments 48 of the active material 44 may have lower source/drain regions 60 beneath the conductive structures 30, upper source/drain regions 62 above the conductive structures 30, and channel regions 64 vertically between the upper and lower source/drain regions. The source/drain regions 60 and 62 may be tailored (e.g., doped) to achieve desired p-type behavior or n-type to behavior, and the channel regions 64 may be tailored (e.g., doped) to achieve a desired threshold voltage. Suitable dopant(s) may include, for example, one or more of niobium, rhenium, chlorine, vanadium, phosphorus, nitrogen, hydrogen, etc. The tailoring of the regions 60, 62 and 64 may be conducted at any suitable process stage(es) with any suitable method(s). For instance, at least some of such tailoring may occur in situ during the deposition of the material 44 at the process stage of FIG. 7. As another example, at least some of such tailoring may occur by implanting one or more dopants at a process stage subsequent to the deposition of the material 44. Additionally, the tailoring may involve activation of modified regions of the material 44 with a thermally-induced anneal and/or with other suitable processing.

The ledges 56 of the active-material-structures 48 may be included within the upper source/drain regions 62, and the bottom regions 52 of the active-material-structures 48 may be included within the lower source/drain regions 60.

In some embodiments, the container-shaped active-material-structures 48 may be considered to have interior regions 66. In the illustrated embodiment, the insulative material 46 is within such interior regions and fills the interior regions.

Insulative material 68 is provided between the segments 48, and a planarized surface 69 is formed to extend across the materials 44, 46 and 68. The planarized surface 69 may be formed with any suitable processing, including, for example, CMP.

The material 68 may comprise any suitable composition(s), including, for example, silicon dioxide, hafnium oxide, zirconium oxide, silicon nitride, etc. In some embodiments, the material 68 may comprise a same composition as the material 32.

Each of the transistors 58 comprises a gating structure 38 adjacent the channel region 64. Each of the gating structures comprises a region of a wordline 30.

The upper and lower source/drain regions 60 and 62 may be about the same size (same vertical height) as one another, and accordingly the transistors 58 may be symmetric devices. Alternatively, the source/drain regions 60 and 62 may be different sizes (different vertical heights) relative to one another, and accordingly the transistors 58 may be asymmetric devices.

In some embodiments, the gating structures 38 may be considered to be operatively adjacent to (operatively proximate to) the channel regions 64 such that a sufficient voltage applied to a gating structure will induce an electric field which enables current flow through an adjacent channel region 64 to electrically couple the source/drain regions 60 and 62 on opposing sides of the channel region with one another. If the voltage to the gating structure is below a threshold level, the current will not flow through the channel region, and the source/drain regions on opposing sides of the channel region will not be electrically coupled with one another. The selective control of the coupling/decoupling of the source/drain regions through the level of voltage applied to the gating structure may be referred to as gated coupling of the source/drain regions. The wordlines 30 may be coupled with drivers (described below with reference to FIG. 14) which are utilized to selectively provide desired voltage to the gating structures 38.

An advantage of the annular shapes of the two-dimensional-material-structures 48 is that such correspond to closed shapes, and thus do not have exposed sidewall edges. One of the difficulties in utilizing two-dimensional-material-structures is that exposed sidewall edges of the structures may be degraded by etching and/or exposure to adjacent materials, which may influence charge mobility in regions proximate the exposed edges. The annular-shaped-structures 48 generally lack exposed sidewall edge regions, and completely lack exposed sidewall edge regions along the channel regions 64. The only exposed sidewall edges of the illustrated annular-shaped-structures 48 are along outer edges of the ledges 56. Such sidewall edges are distal from the junctions between the channel regions 64 and the source/drain regions 60 and 62 of the active-material-structures 48, and thus do not significantly impact the overall performance of the transistors 58.

Another advantage of the annular shapes of the two-dimensional-material-structures 48 is that such may provide structural rigidity within the openings 36 (FIGS. 7 and 7A) to alleviate a risk of delamination of the two-dimensional material 44 from the immediately-adjacent surfaces. A problem which may be encountered with two-dimensional-materials is that the materials do not adhere well to other materials. The structural rigidity provided by the annular shapes of the two-dimensional-material-structures 48 may overcome such problem.

An advantage of the utilization of the two-dimensional material as the channel material of the transistors 58 is that such may enable the channel lengths to be kept short while still enabling suitable operational control of the channel regions with the adjacent gating structures 38. In some embodiments, the transistors 58 may have an overall height, H, within a range of from about 10 nm to about 100 nm, and the gating structures 38 (and channel regions 64) may have a length, L, within a range of from about 5 nm to about 50 nm. In some embodiments, the transistors 58 may be formed with processing having reasonably low critical dimensions since the transistors may be kept relatively short as compared to conventional transistors. It is generally easier and cheaper to fabricate structures with low critical dimensions as compared to structures with higher critical dimensions.

The thin material 44 of the channel regions may enable good electrostatic control of the channel regions. Such may enable good electrostatic coupling between a gating region 38 and a channel region 64 operatively proximate the gating region, and may enable problematic interactions from distant wordlines (so-called cross-talk) to be avoided, or even entirely eliminated.

Figure 9A:
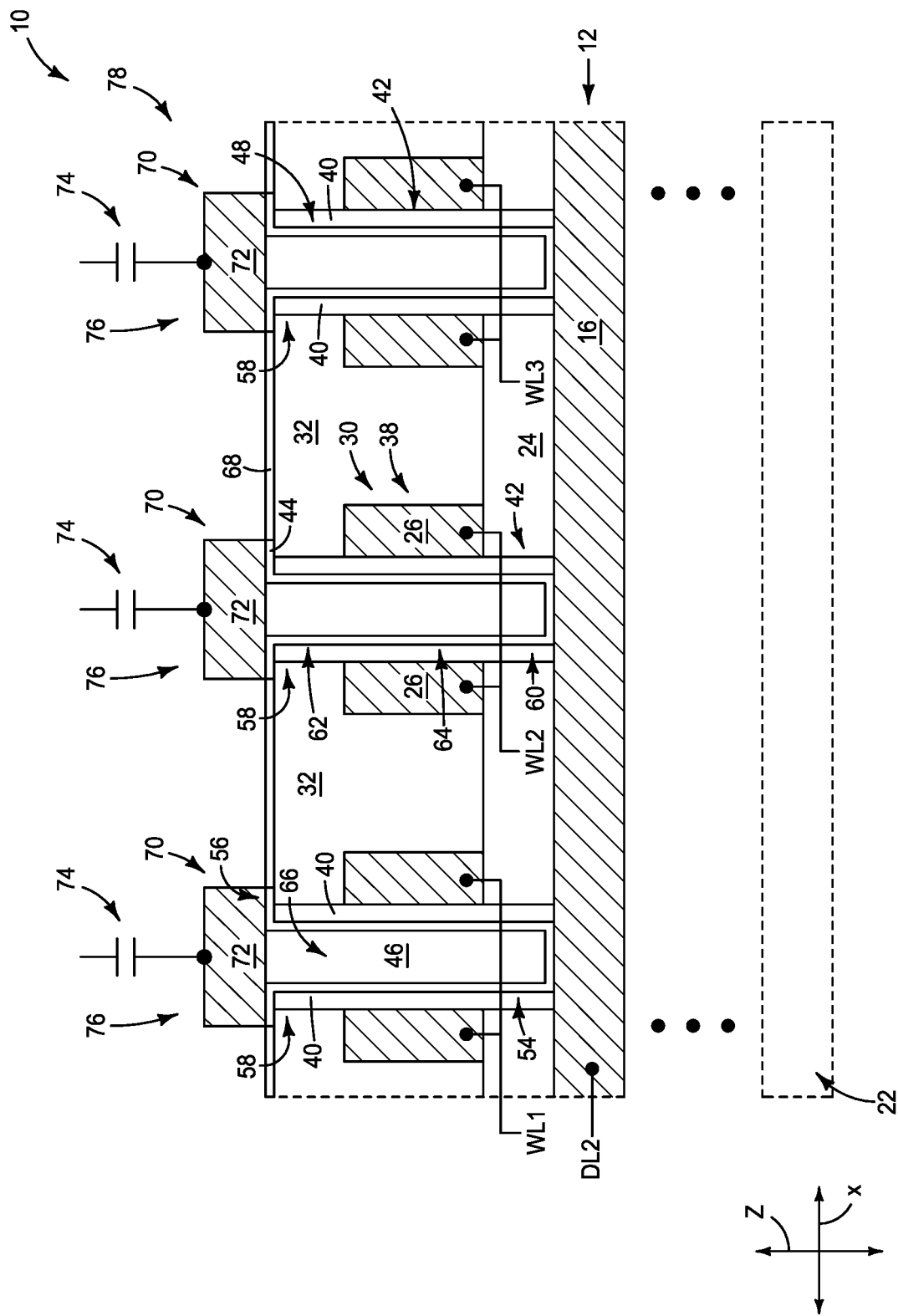

Referring to FIGS. 9 and 9A, conductive structures 70 are formed over the ledge regions 56. In the shown embodiment, the conductive structures 70 are formed directly against the two-dimensional material 44 of the ledge regions 56, and are formed directly against the insulative material 46. The conductive structures 70 are shown to extend entirely across an upper surface of the insulative material 46. The conductive structures 70 may be considered to cap the interior regions 66 of the active-material-structures 48. Insulative material (not shown) may be provided over the material 68 and between the conductive structures 70.

The conductive structures 70 are shown to be configured as a blocks, and in the illustrated embodiment are circular blocks. In other embodiments, the blocks may have other suitable shapes, including, for example, round, elliptical, polygonal, etc.

The blocks 70 comprise conductive material 72. The conductive material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 72 may comprise a same composition as one or both of the conductive materials 16 and 26 of the conductive structures 12 and 30. In some embodiments, the structures 70 may be referred to as conductive interconnect structures. In some embodiments, the structures 70 may be omitted.

Storage elements 74 are electrically coupled with the upper source/drain regions 62 through the conductive structures (interconnects) 70. The storage elements 74 are shown to be capacitors. It is to be understood, however, that the storage elements 74 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The storage elements 74 and access devices 58 together form memory cells 76 of a memory array 78.

The conductive lines 12 of FIGS. 9 and 9A are shown to correspond to digit lines DL1-DL4, and the conductive lines 30 are shown to correspond to wordlines WL1-WL3.

The digit lines DL1-DL4 extend along a first direction corresponding to the illustrated x-axis direction, and the wordlines WL1-WL3 extend along a second direction corresponding to the illustrated y-axis direction. The second direction of the wordlines crosses the first direction of the digit lines. In the shown embodiment, the second direction of the wordlines is orthogonal to (or at least substantially orthogonal to) the first direction of the digit lines. The term "substantially orthogonal" means orthogonal to within reasonable tolerances of fabrication and measurement. In other embodiments, the wordlines may cross the digit lines at other angles.

The wordlines (e.g., WL1) and digit lines (e.g., DL1) are shown to be substantially straight. In other embodiments, the wordlines and/or the digit lines may be curved, wavy, etc.

Another example embodiment is described with reference to FIGS. 10 and 11.

Figure 10:
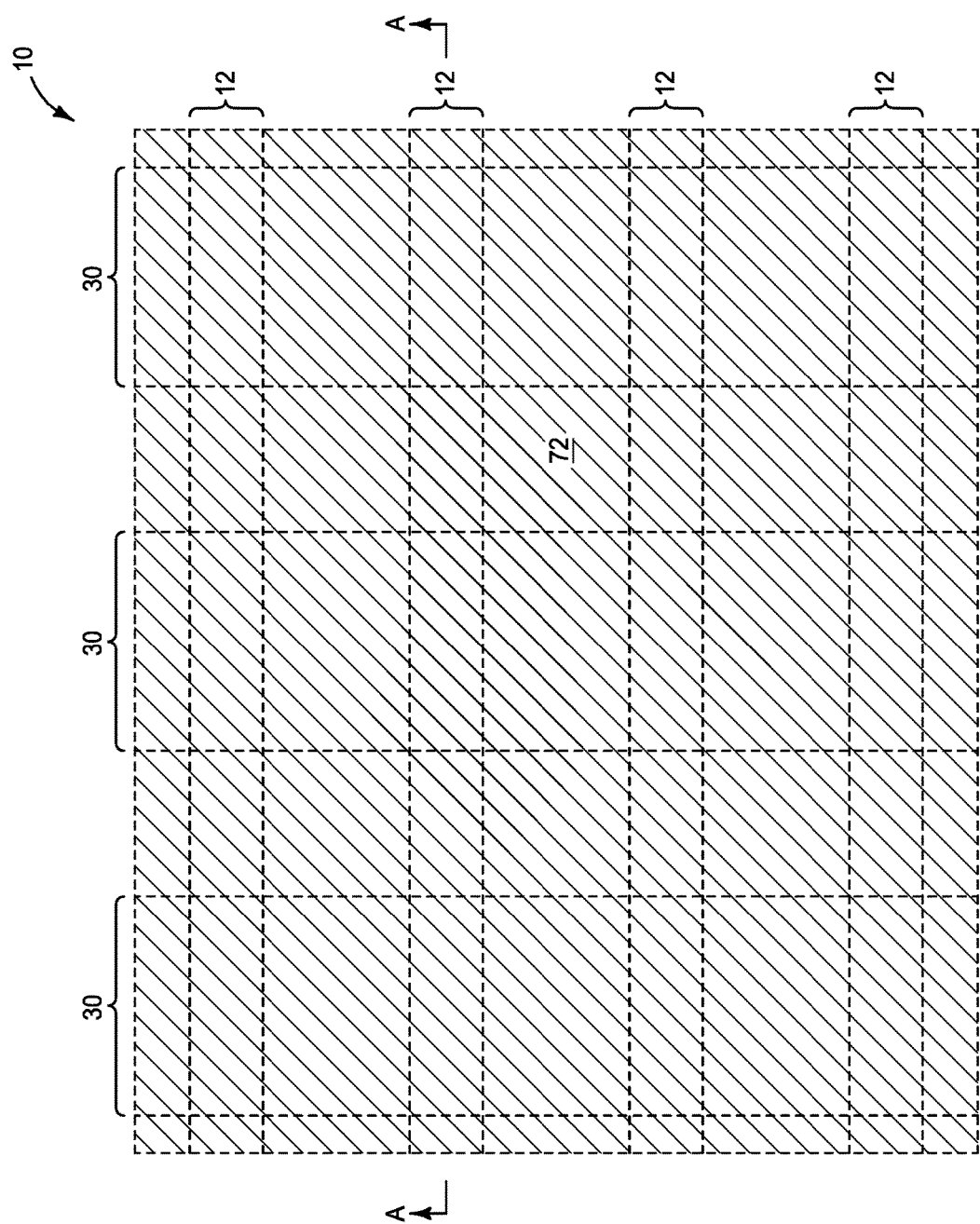
FIGS. 10 and 11 are diagrammatic top-down views of a region of an example integrated assembly at example sequential process stages of an example method. The process stage of FIG. 10 may follow that of FIG. 7.
Figure 10A:
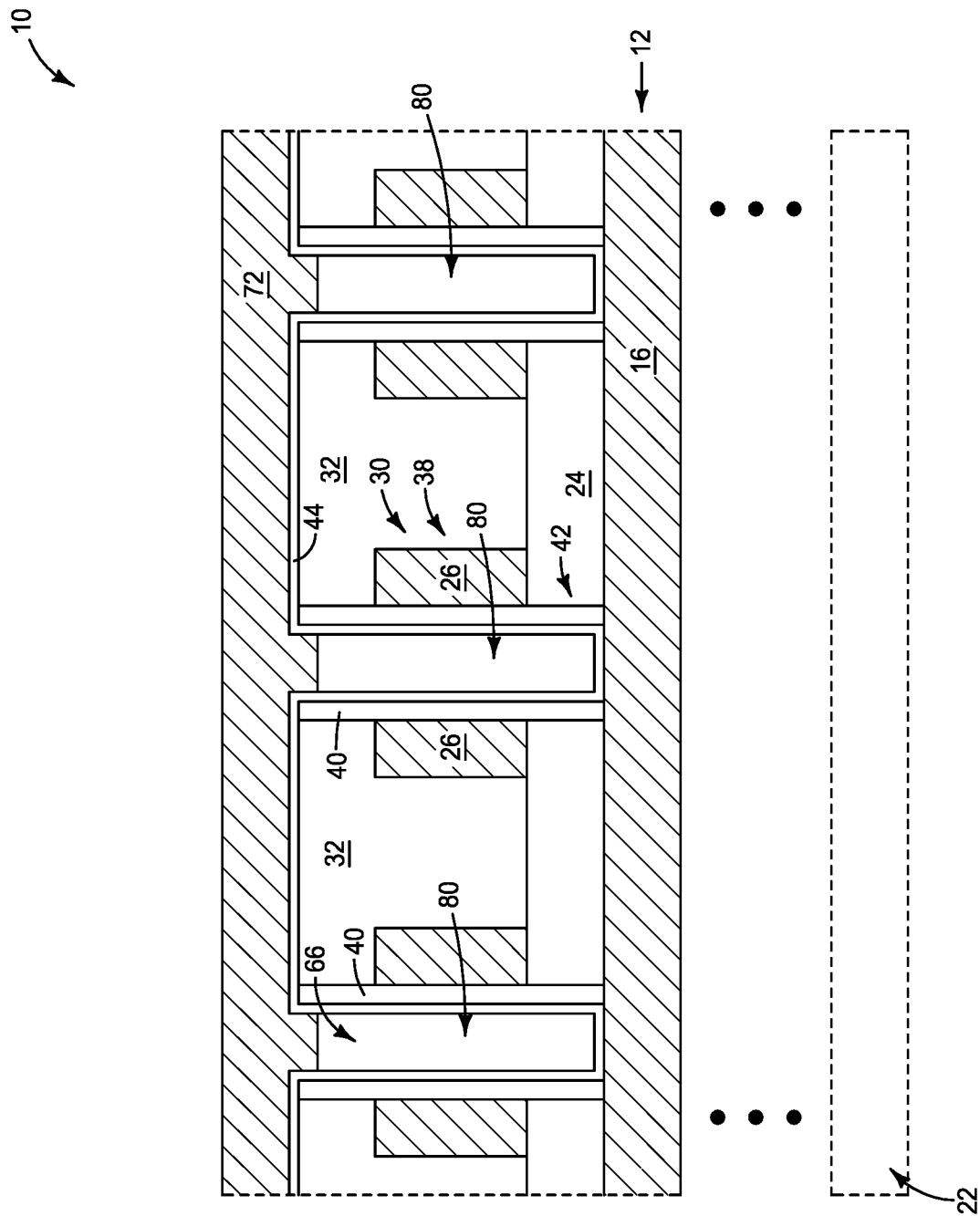
FIGS. 10A and 11A are diagrammatic cross-sectional side views along the lines A-A of FIGS. 10 and 11, respectively.

Referring to FIGS. 10 and 10A, the assembly 10 is shown at a process stage which may follow the process stage of FIG. 7. The conductive material 72 is formed over the two-dimensional material 44, and extends across the interior regions 66 to trap voids 80 within such interior regions. The voids 80 may be referred to as gas-filled voids. In some embodiments, the gas within the voids 80 may be air. In some embodiments, the gas within the voids 80 may be inert process gas, such as, for example, nitrogen, argon, etc. In some embodiments, the voids 80 may contain at least partial vacuum (i.e., pressure within the voids may be subatmospheric).

Figure 11A:
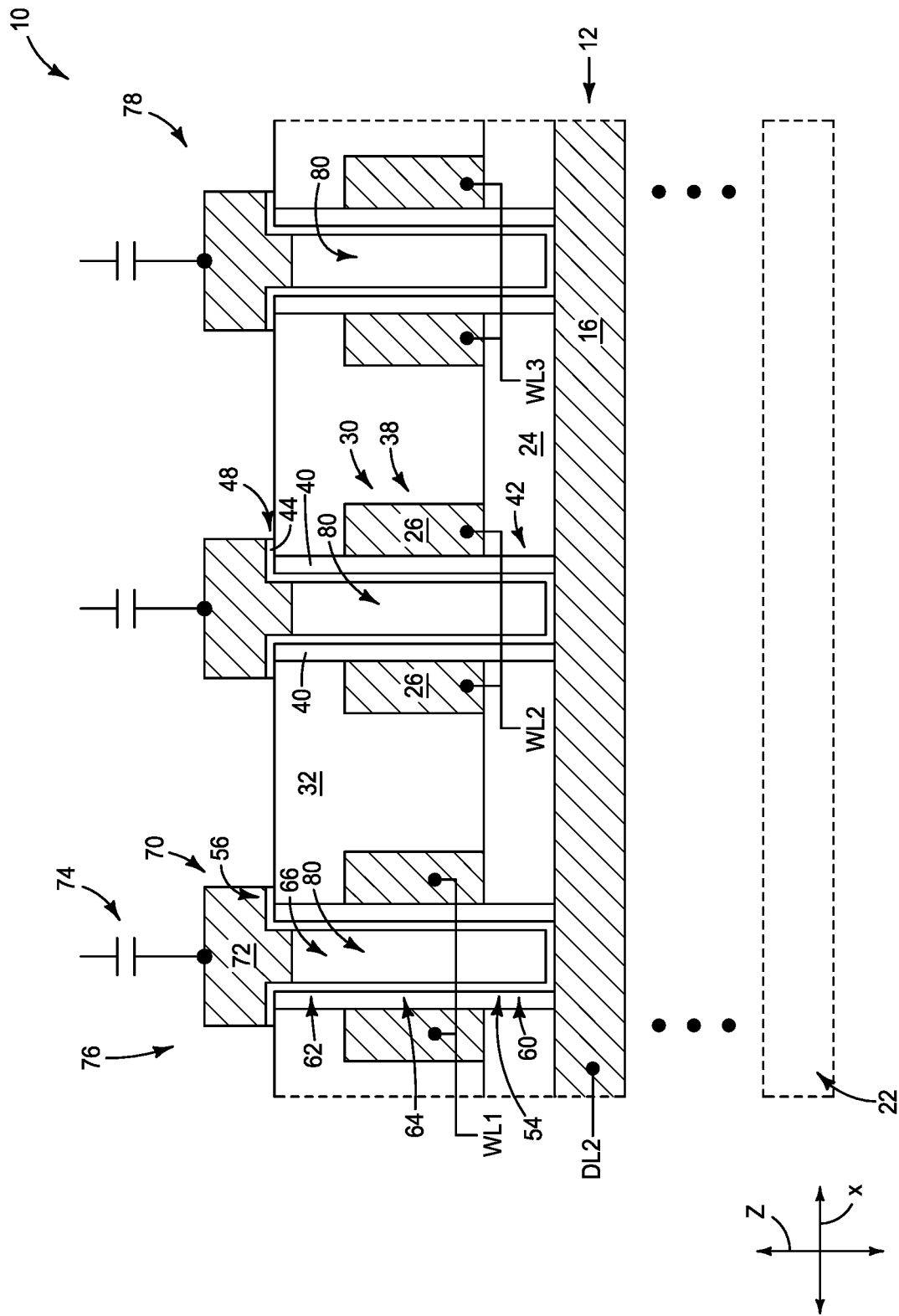

Referring to FIGS. 11 and 11A, the materials 44 and 72 are patterned into the structures 48 and 70, respectively. In the illustrated embodiment, such patterning comprises etching through the materials 72 and 44, with such etching stopping at an upper surface of the insulative material 32. In other embodiments, the etching may penetrate into the insulative material 32. Additional insulative material (not shown) may be provided laterally between the structures 70 and 48.

The configuration of FIGS. 11 and 11A forms a memory array 78 analogous to that described above with reference to FIGS. 9 and 9A. However, the configuration of FIGS. 11 and 11A differs from that of FIGS. 9 and 9A in that the voids (void regions) 80 are within the interior regions 66 (shown in the cross-section of FIG. 11A), instead of the insulative material 46 (shown in the cross-section of FIG. 9A).

In some embodiments, the two-dimensional material 44 may pinch-off across the interior regions 66 so that the void regions 80 are capped by both the conductive material 72 and the two-dimensional material 44. For instance, FIG. 12 shows a process stage which may follow the process stage of FIG. 6A. The two-dimensional material 44 extends into the openings 36 to pinch-off across the tops of the openings. In the illustrated embodiment, the two-dimensional material has formed non-conformally along the upper regions of the openings 36, and thus forms the pinched-off regions 82. The likelihood of pinching off across the openings 36 with the two-dimensional material 44 may increase as the widths of the openings are decreased with higher levels of integration. In the illustrated embodiment, additional void regions 80 are adjacent the pinched-off regions 82 due to the non-conformality of the deposition of the material 44.

FIG. 13 shows the assembly 10 of FIG. 12 after it has been processed analogously to the processing described above with reference to FIGS. 11 and 11A. The configuration of FIG. 13 has the voids 66 capped by the pinched-off regions 82 of the active-material-structures 48 in addition to being capped by the conductive structures 72.

The embodiment of FIG. 13 shows the upper source/drain regions 62 of the active-material-structures 48 as being configured substantially differently than the bottom source/drain regions 60. Such dramatic difference between the upper and lower source/drain regions 62 and 60 is due to the structures of the illustration being depicted to a scale and arrangement which emphasizes the pinched-off regions 82, and may or may not occur in actual practice.

Figure 14:
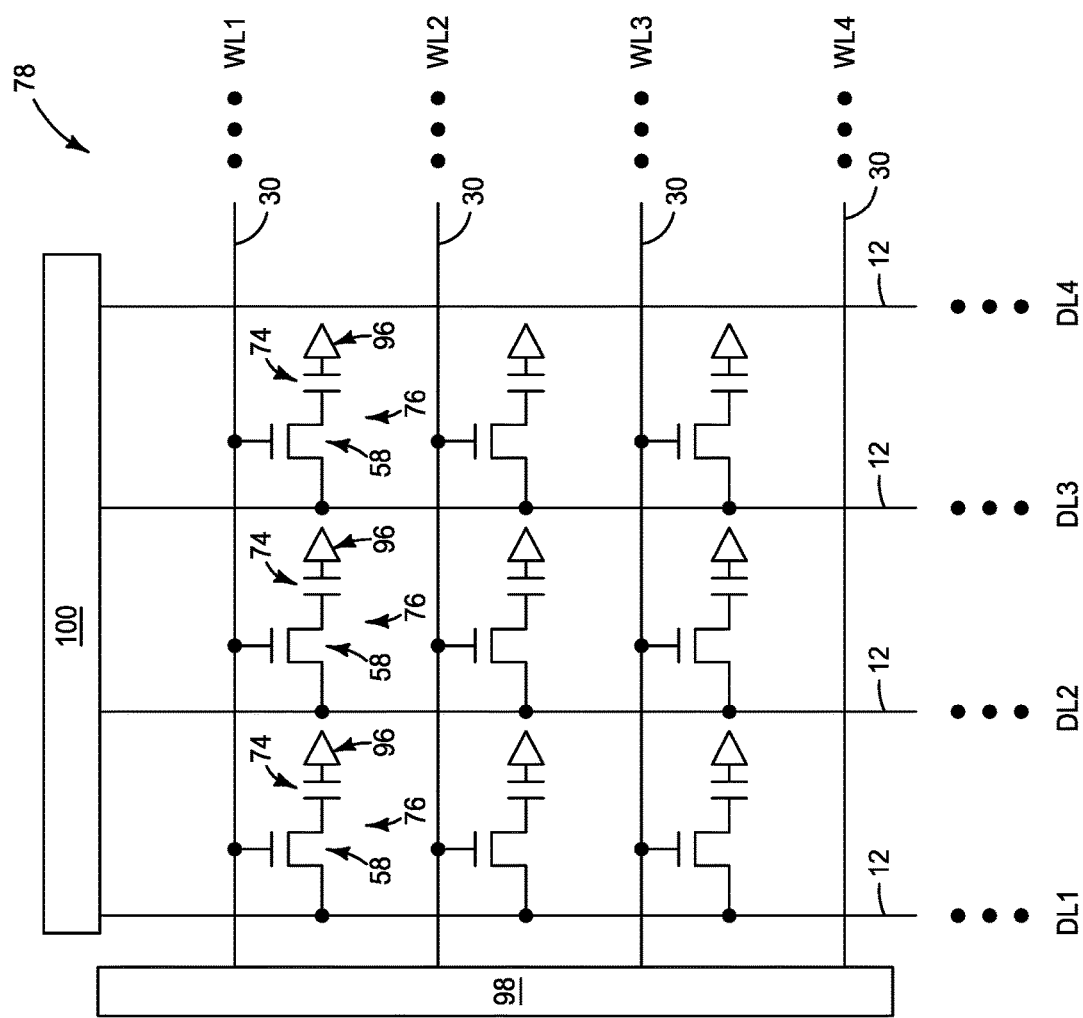
FIG. 14 is a diagrammatic schematic view of a region of an example memory array.

The memory arrays 78 described above may have any suitable configurations. FIG. 14 shows an example configuration in which the storage elements 74 are capacitors. The capacitors may be non-ferroelectric capacitors, and accordingly the memory array 78 may be a dynamic random access memory (DRAM) array. Alternatively, the capacitors may be ferroelectric capacitors, and accordingly the memory array 78 may be a ferroelectric random access memory (FeRAM) array.

The illustrated capacitors 74 each have an electrical node coupled with an access transistor 58, and have another electrical node coupled with a reference 96. The reference 96 may correspond to any suitable reference voltage, including, ground, VCC/2, etc.

The wordlines 30 are shown coupled with wordline-driver-circuitry 98, and the digit lines 12 are shown coupled with sense-amplifier-circuitry 100. The access transistors 58 and storage elements 74 together form the memory cells 76, with each of the memory cells being uniquely addressed by one of the digit lines 12 in combination with one of the wordlines 30.

The various structures, openings, trenches, etc., described herein may be patterned with any suitable processing. For instance, a photolithographically-patterned photoresist mask may be utilized to define locations of the structures, openings, trenches, etc.; one or more etches may be utilized to make the structures, openings, trenches, etc.; and then the mask may be removed to leave the illustrated configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a conductive structure, an annular structure extending through the conductive structure, and an active-material-structure lining an interior periphery of the annular structure. The annular structure includes dielectric material. The active-material-structure includes two-dimensional-material.

Some embodiments include an integrated assembly having first conductive structures extending along a first direction, and having first insulative material over the first conductive structures. Second conductive structures are over the first insulative material and extend along a second direction which crosses the first direction. Insulative rings extend through the second conductive structures. Active-material-structures line interior peripheries of the insulative rings. The active-material-structures comprise two-dimensional-material. The active-material-structures have lower source/drain regions beneath the second conductive structures, upper source/drain regions above the second conductive structures, and channel regions between the upper and lower source/drain regions. The lower source/drain regions are electrically coupled with the first conductive structures. Storage elements are electrically coupled with the upper source/drain regions.

Some embodiments include a method of forming an integrated assembly. A first construction is formed to have first conductive structures which extend along a first direction and which are spaced from one another along a second direction. Intervening first insulative regions are between the spaced-apart first conductive structures. The first conductive structures comprise first conductive material. First insulative material is formed over the first construction. A second construction is formed over the first insulative material. The second construction has second conductive structures extending along the second direction. The second conductive structures are spaced from one another along the first direction. Intervening second insulative regions are between the spaced-apart second conductive structures. The second construction includes second insulative material over the second conductive structures. Openings are formed to extend through the second insulative material, the second conductive structures, and the first insulative material. The openings extend to the first conductive structures. The second conductive structures comprise second conductive material. Gating structures comprise regions of the second conductive material adjacent the openings. The openings are lined with dielectric material to narrow the openings. Two-dimensional-material is formed to extend along an upper surface of the second insulative material, and to extend into the narrowed openings. The two-dimensional-material is patterned into segments. Each of the segments includes a container-shape which extends into an associated one of the openings. Each of the container-shapes includes a bottom region adjacent the first conductive material, a ring-shaped sidewall region extending upwardly from the bottom region, and a ledge region extending outwardly from the sidewall region. The ledge regions are over the second insulative material. The container-shapes include upper source/drain regions, lower source/drain regions, and channel regions between the upper and lower source/drain regions. The channel regions are operatively proximate the gating structures. Storage elements are formed over the segments and are electrically coupled with the upper source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a first construction having first conductive structures extending along a first direction and spaced from one another along a second direction; intervening first insulative regions being between the spaced-apart first conductive structures; the first conductive structures comprising first conductive material;
    forming first insulative material over the first construction;
    forming a second construction over the first insulative material; the second construction having second conductive structures extending along the second direction and spaced from one another along the first direction; intervening second insulative regions being between the spaced-apart second conductive structures; the second construction including second insulative material over the second conductive structures;

forming openings extending through the second insulative material, the second conductive structures, and the first insulative material; the openings extending to the first conductive structures; the second conductive structures comprising second conductive material; gating structures comprising regions of the second conductive material adjacent the openings;

lining the openings with dielectric material to narrow the openings;

forming two-dimensional-material to extend along an upper surface of the second insulative material, and to extend into the narrowed openings;

patterning the two-dimensional-material into segments; each of the segments including a container-shape which extends into an associated one of the openings; each of the container-shapes including a bottom region adjacent the first conductive material, a ring-shaped sidewall region extending upwardly from the bottom region, and a ledge region extending outwardly from the sidewall region; the ledge regions being over the second insulative material; the container-shapes including upper source/drain regions, lower source/drain regions, and channel regions between the upper and lower source/drain regions; the channel regions being operatively proximate the gating structures; and forming storage elements over the segments and electrically coupled with the upper source/drain regions.

2. The method of claim 1 wherein the second insulative material is within the second intervening regions.

3. The method of claim 1 further comprising forming conductive interconnects directly on the ledge regions, and forming the storage elements to be over the conductive interconnects and to be electrically coupled with the conductive interconnects.

4. The method of claim 3 further comprising forming third insulative material within interior regions of the container-shapes, and forming the conductive interconnects extend across the third insulative material.

5. The method of claim 3 wherein the conductive interconnects extend across interior regions of the container-shapes, and wherein voids are within such interior regions.

6. The method of claim 5 wherein the two-dimensional material pinches off across said voids.

7. The method of claim 5 wherein the first conductive structures are digit lines, and wherein the second conductive structures are wordlines.

8. The method of claim 1 wherein the two-dimensional-material is substantially entirely monocrystalline.

9. A method of forming an integrated assembly, comprising:

forming a conductive line;

forming a conductive structure over the conductive line;

forming an annular structure extending through the conductive structure, the annular structure comprising dielectric material; and forming an active-material-structure lining an interior periphery of the annular structure, the active-material-structure comprising two-dimensional-material, the active-material-structure having an annular portion having an upper region, a lower region and an intermediate region between the upper region and the lower region, the active-material-structure having a base portion entirely closing a bottom of the lower region of the annular structure, an entirety of a bottom surface of the base being in direct physical contact with the conductive line.

10. The method of claim 9 wherein the annular structure and the active-material-structure have upper surfaces above an upper surface of the conductive structure; and further comprising forming a conductive material over the upper surfaces of the annular structure and the active-material-structure and capping an interior region of the active-material-structure.

11. The method of claim 10 wherein a void is disposed within said interior region.

12. The method of claim 11 wherein the void is also capped by a region of the active-material-structure that extends across a top of the void.

13. The method of claim 10 comprising forming insulative material within said interior region.

14. The method of claim 13 wherein the insulative material comprises silicon dioxide.

15. The method of claim 13 wherein the insulative material comprises one or more high-k compositions.

16. The method of claim 10 wherein a portion of the active-material-structure is configured as a ledge region over the upper surface of the annular structure, and wherein the conductive material is directly against the ledge region.

17. The method of claim 16 wherein the active-material-structure has no exposed sidewall edges except for sidewall edges of the ledge region.

18. The method of claim 10 wherein the conductive structure is a first conductive structure; wherein the active-material-structure has a bottom surface beneath a bottom surface of the first conductive structure; and further comprising forming a second conductive structure under the bottom surface of the active-material-structure and directly against the bottom surface of the active-material-structure.

19. The method of claim 10 comprising forming a storage element electrically coupled with the conductive material.

20. The method of claim 19 wherein the storage element is a capacitor.

* * * * *